(12) United States Patent
Krupyshev et al.

(10) Patent No.: US 11,764,093 B2
(45) Date of Patent: Sep. 19, 2023

(54) AUTOMATIC WAFER CENTERING METHOD AND APPARATUS

(71) Applicant: Brooks Automation, Inc., Chelmsford, MA (US)

(72) Inventors: Alexander Krupyshev, Chelmsford, MA (US); Leigh F. Sharrock, Londonderry, NH (US)

(73) Assignee: Brooks Automation US, LLC, Chelmsford, MA (US)

( * ) Notice: Subject to any disclaimer, the term of this patent is extended or adjusted under 35 U.S.C. 154(b) by 0 days.

(21) Appl. No.: 17/398,847

(22) Filed: Aug. 10, 2021

(65) Prior Publication Data

US 2021/0375657 A1 Dec. 2, 2021

Related U.S. Application Data

(63) Continuation of application No. 16/257,595, filed on Jan. 25, 2019, now Pat. No. 11,088,004.

(Continued)

(51) Int. Cl.
*H01L 21/68* (2006.01)
*B25J 9/16* (2006.01)
(Continued)

(52) U.S. Cl.
CPC .......... *H01L 21/681* (2013.01); *B25J 9/1697* (2013.01); *B25J 11/0095* (2013.01);
(Continued)

(58) Field of Classification Search
CPC ............ H01L 21/681; H01L 21/67196; H01L 21/67259; H01L 21/67742;
(Continued)

(56) References Cited

U.S. PATENT DOCUMENTS 5,297,238 A 3/1994 Wang et al.
5,905,850 A 5/1999 Kaveh
(Continued)

FOREIGN PATENT DOCUMENTS

CN 103991078 8/2014
CN 105981154 9/2016
(Continued)

OTHER PUBLICATIONS

International Search Report for International Application No. PCT/US19/15553, dated Apr. 15, 2019.
(Continued)

*Primary Examiner* — Basil T. Jos
(74) *Attorney, Agent, or Firm* — Perman & Green, LLP

(57) ABSTRACT

A substrate transport apparatus including a transport chamber, a drive section, a robot arm having an end effector at a distal end configured to support a substrate and being connected to the drive section generating at least arm motion in a radial direction extending and retracting the arm, an imaging system with a camera mounted in a predetermined location to image at least part of the robot arm, and a controller connected to the imaging system to image the arm moving to a predetermined repeatable position, the controller effecting capture of a first image of the robot arm proximate to the repeatable position decoupled from encoder data of the drive axis, wherein the controller calculates a positional variance of the robot arm from comparison of the first image with a calibration image, and from the positional variance determines a motion compensation factor changing the extended position of the robot arm.

33 Claims, 26 Drawing Sheets

Related U.S. Application Data

(60) Provisional application No. 62/623,843, filed on Jan. 30, 2018.

(51) Int. Cl.
*B25J 11/00* (2006.01)
*B65G 47/90* (2006.01)
*H01L 21/67* (2006.01)
*H01L 21/677* (2006.01)
*H01L 21/687* (2006.01)

(52) U.S. Cl.
CPC ...... *B65G 47/905* (2013.01); *H01L 21/67196* (2013.01); *H01L 21/67259* (2013.01); *H01L 21/67742* (2013.01); *H01L 21/67748* (2013.01); *H01L 21/67754* (2013.01); *H01L 21/68707* (2013.01); *H01L 21/67167* (2013.01)

(58) Field of Classification Search
CPC ......... H01L 21/67748; H01L 21/67754; H01L 21/68707; H01L 21/67167; H01L 21/67248; H01L 21/67745; B25J 9/1697; B25J 11/0095; B65G 47/905
See application file for complete search history.

(56) References Cited

U.S. PATENT DOCUMENTS

| | | | |
|---|---|---|---|
| 6,516,244 B1 | 2/2003 | Yoo et al. | |
| 6,900,877 B2 | 5/2005 | Raaijmakers | |
| 7,233,841 B2 | 6/2007 | Sadighi et al. | |
| 7,813,832 B2 | 10/2010 | Sundar | |
| 9,211,643 B1 | 12/2015 | Shirakyan et al. | |
| 9,221,176 B2 | 12/2015 | Suzuki | |
| 9,269,529 B2 | 2/2016 | Rodnick et al. | |
| 9,514,974 B2 | 12/2016 | Sharrock | |
| 9,548,231 B2 | 1/2017 | Hosek et al. | |
| 9,842,757 B2 | 12/2017 | Hosek et al. | |
| 10,052,766 B2 | 8/2018 | Shirakyan et al. | |
| 10,134,621 B2 | 11/2018 | Caveney et al. | |
| 11,273,558 B2 | 3/2022 | Caveney | |
| 11,476,138 B2 | 10/2022 | Goto et al. | |
| 2004/0158347 A1 | 8/2004 | Sha et al. | |
| 2004/0230341 A1 | 11/2004 | Suh et al. | |
| 2008/0077271 A1 | 3/2008 | Sundar | |
| 2010/0080444 A1 | 4/2010 | Yamaguchi et al. | |
| 2011/0280472 A1 | 11/2011 | Wallack et al. | |
| 2014/0207284 A1 | 7/2014 | Kiley et al. | |
| 2014/0229005 A1 | 8/2014 | Suzuki | |
| 2014/0365011 A1* | 12/2014 | Hosek .................. | B25J 9/1682 700/259 |
| 2015/0375396 A1 | 12/2015 | Shirakyan et al. | |
| 2016/0136812 A1 | 5/2016 | Hosek et al. | |
| 2017/0028560 A1 | 2/2017 | Senn | |

FOREIGN PATENT DOCUMENTS

| | | |
|---|---|---|
| CN | 106103011 | 11/2016 |
| CN | 106461383 | 2/2017 |
| CN | 1059114 | 1/2019 |
| JP | 2000232147 | 8/2000 |
| JP | 2003086658 | 3/2003 |
| JP | 2004080001 | 3/2004 |
| JP | 2018056256 | 4/2018 |
| KR | 20140003762 | 6/2014 |
| TW | 497136 | 8/2002 |
| TW | 201523762 | 6/2015 |
| WO | 20170114581 | 1/2017 |

OTHER PUBLICATIONS

Supplementary European Search Report Application No. PCT? US2019015553, dated Sep. 24, 2021.

* cited by examiner

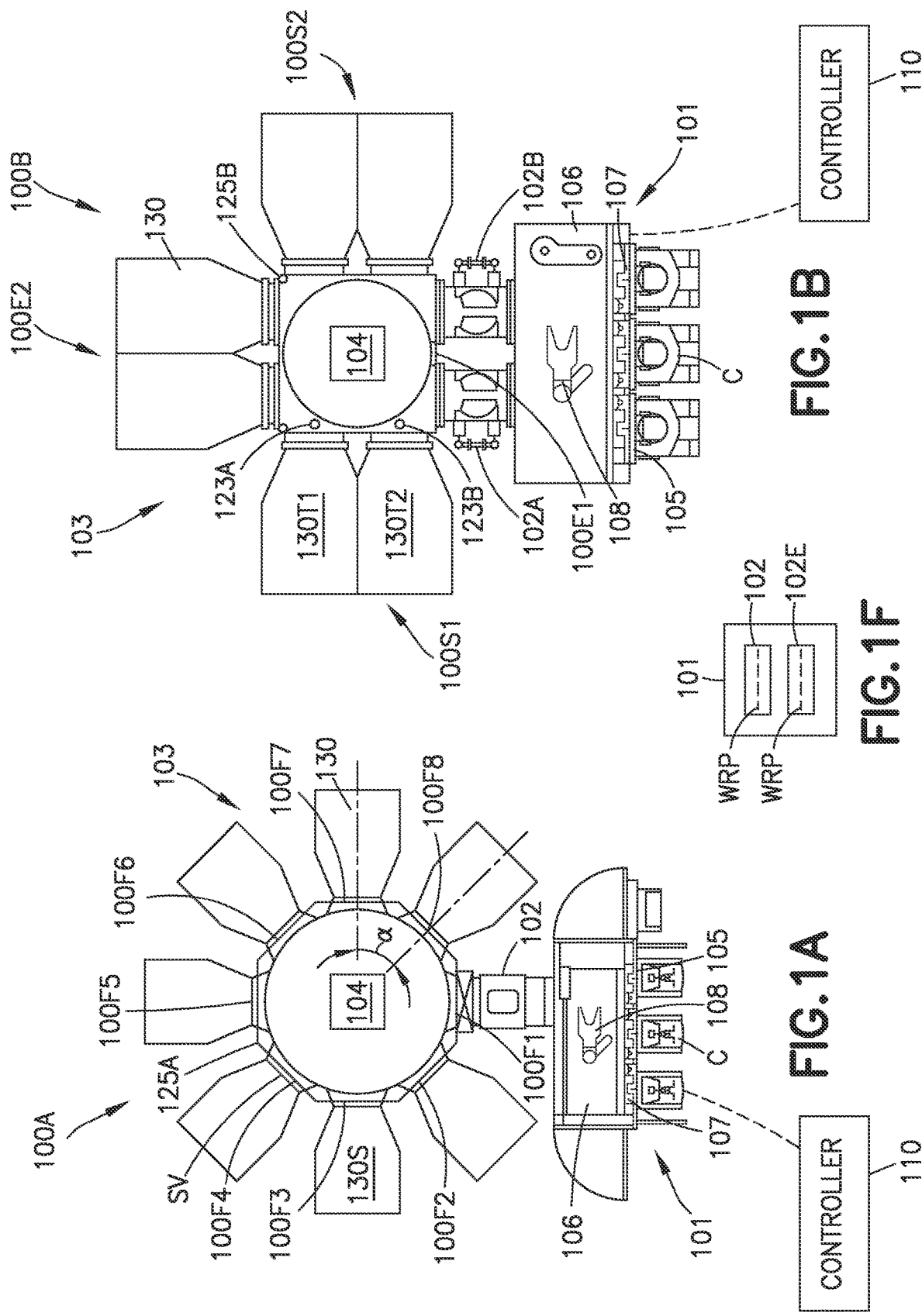

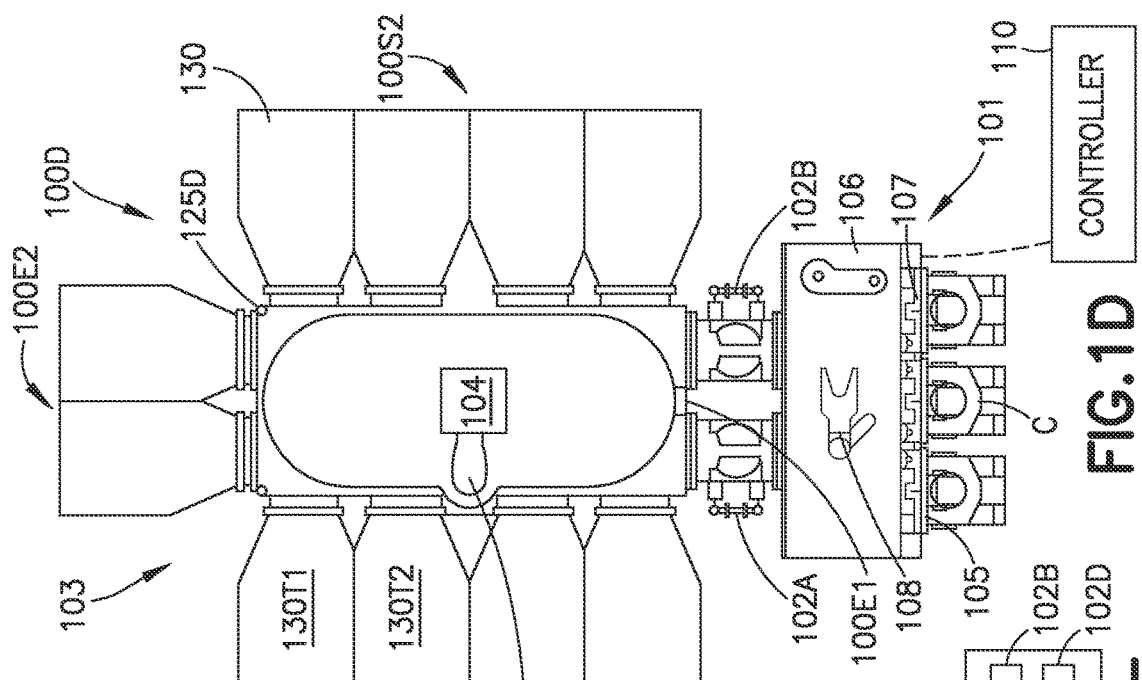
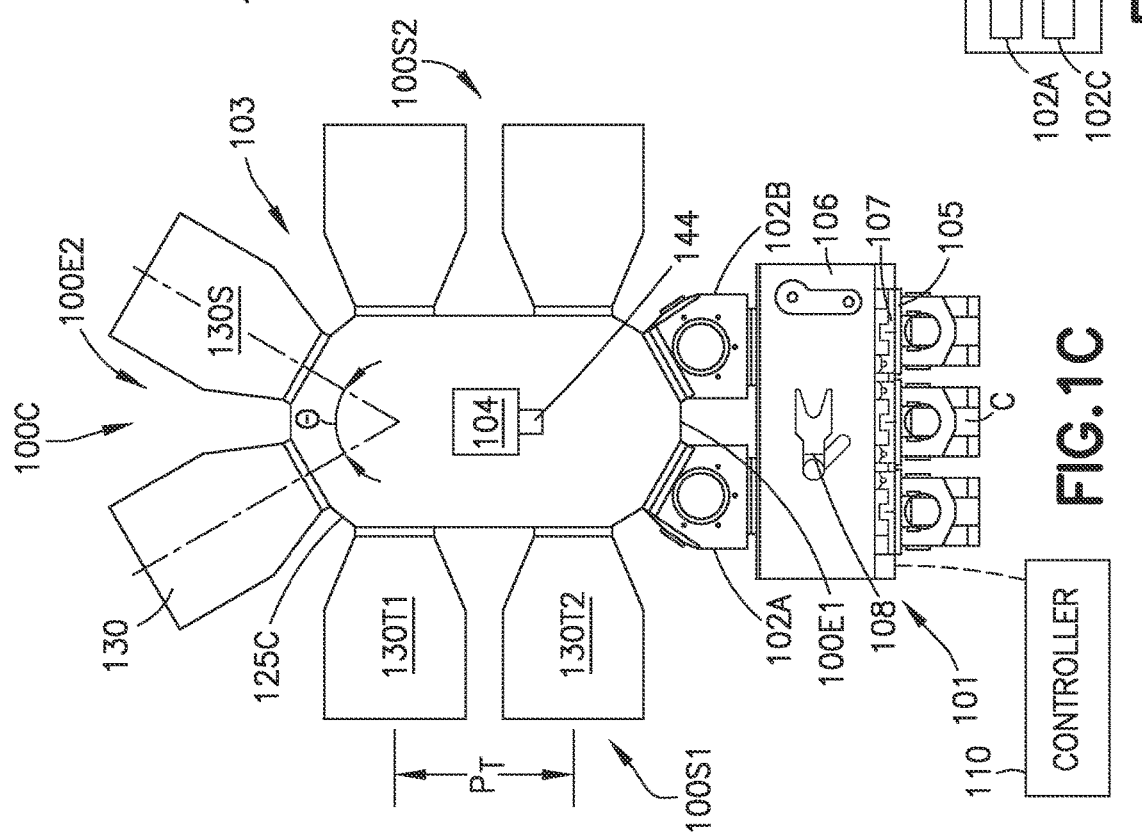

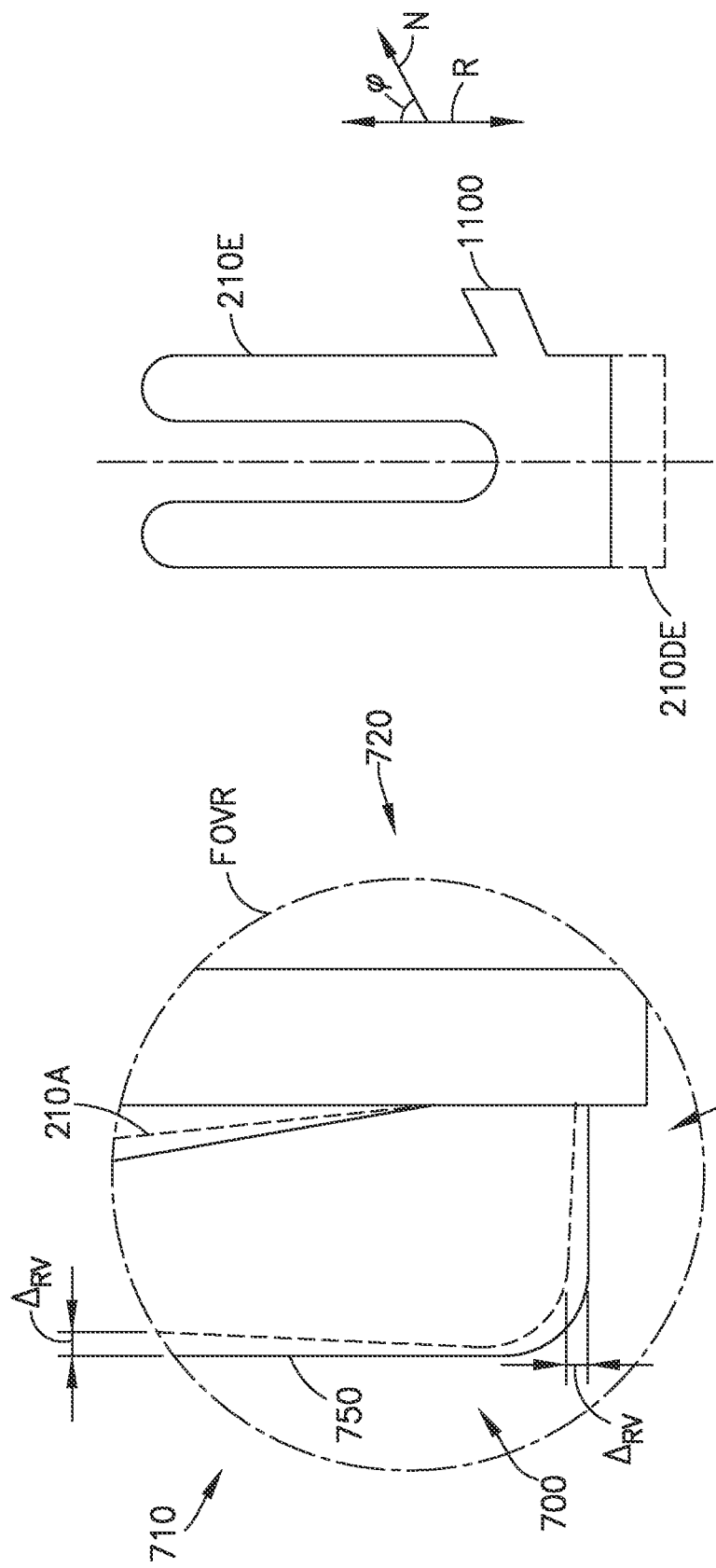

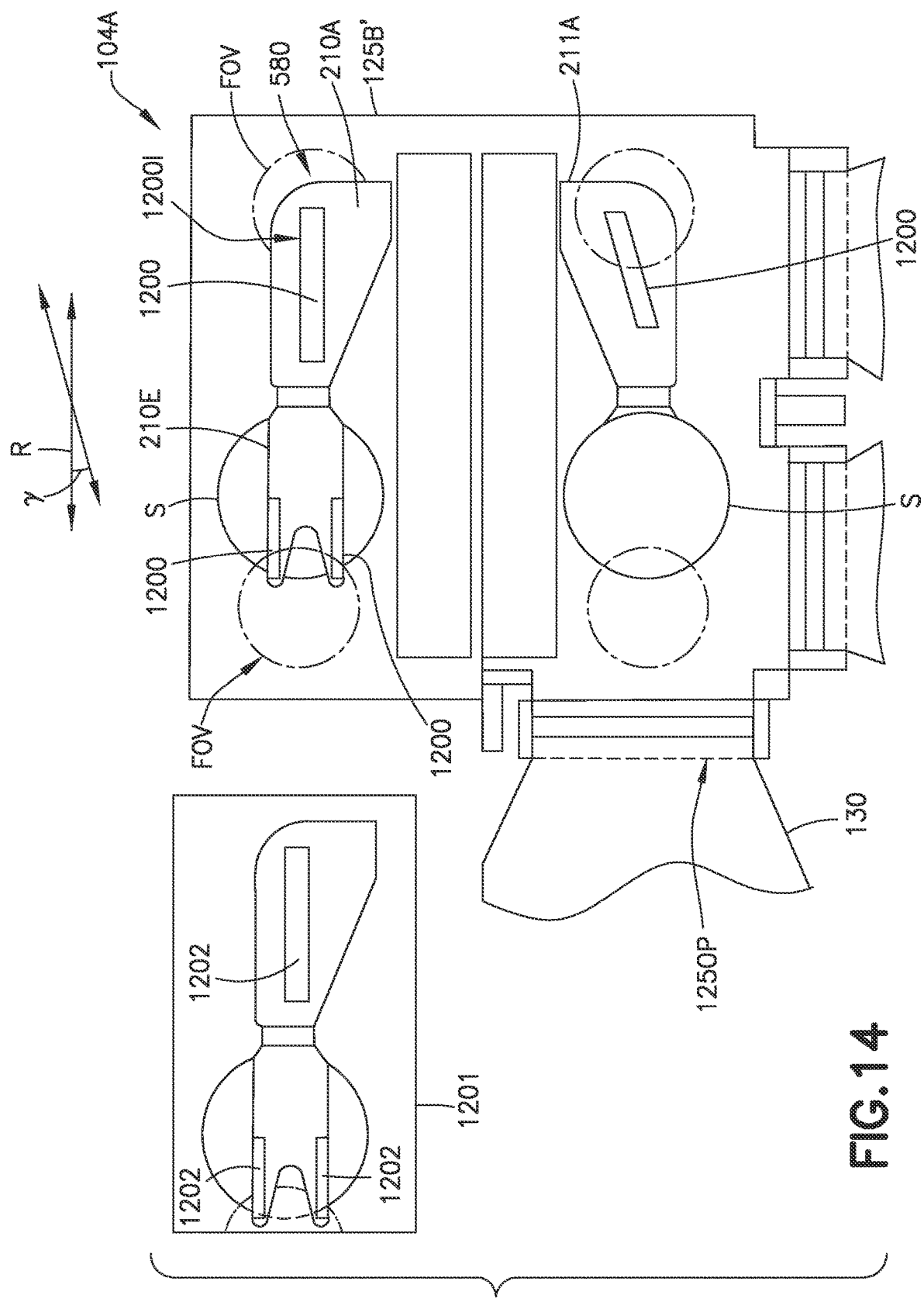

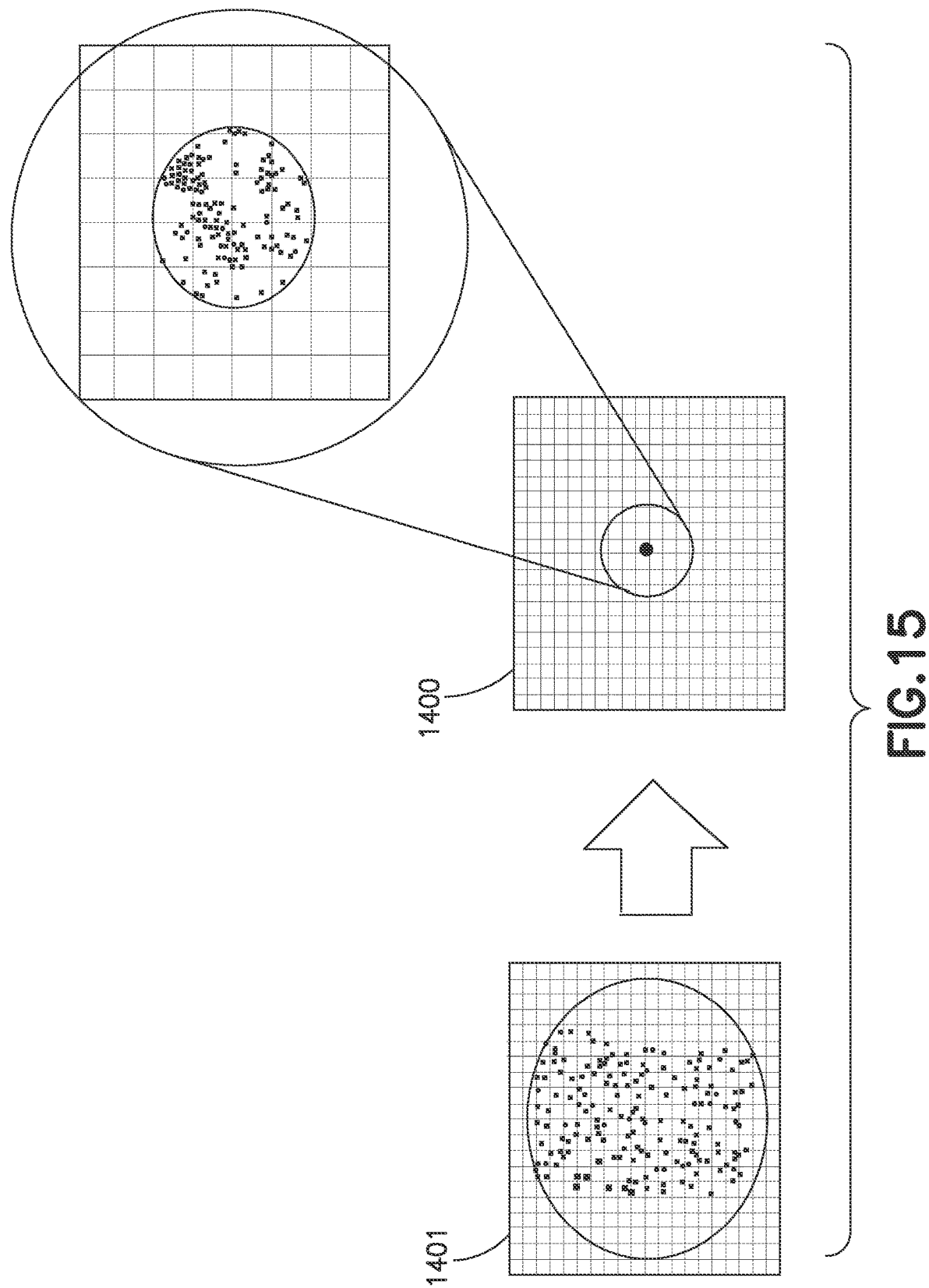

AUTOMATIC WAFER CENTERING METHOD AND APPARATUS

CROSS-REFERENCE TO RELATED APPLICATIONS

This Non-Provisional Patent Application is a continuation of Ser. No. 16/257,595, filed Jan. 25, 2019, (now U.S. Pat. No. 11,088,004), which claims priority to and the benefit of U.S. Provisional Patent Application No. 62/623,843, filed Jan. 30, 2018, the disclosures of which one incorporated herein by reference in their entireties.

BACKGROUND

1. Field

The exemplary embodiments generally relate to substrate processing apparatus, and more particularly, to substrate transport apparatus.

2. Brief Description of Related Developments

A substrate transport robot within a transfer chamber moves substrates among different process modules where different operations, such as etching, coating, etc. are performed. Production processes used by, for example, semiconductor device manufacturers and materials producers often require precise positioning of substrates in the substrate processing equipment. Accurate placement of the substrates may be hindered by various factors, such as, e.g., thermal effects. For example, thermal expansion and contraction of the substrate transport robot may shift a position of the substrate from the desired position via, e.g., thermal expansion or contraction of the robot components. A processing system that does not take into account these various factors that affect the transport robot may be inundated with inaccurate placement of the substrates.

Several methods and apparatus have been utilized to provide position compensation for substrates and various components of the substrate transport robot. In one approach, optical sensors are disposed in, e.g., the transfer chamber. When the transport robot or substrate passes by the optical sensor, the system can determine the position of the substrate with respect to the end effector of the transport robot using, e.g., encoder data on the motor of the transport robot. Based on the detected position, the system can correct for substrate position errors. The process of determining the position based on encoder data is difficult and cumbersome and may slow down processing time.

As semiconductor device dimensions have decreased, increased handling accuracy is desirable, thus it would be advantageous to provide a substrate processing apparatus providing increased accuracy with position compensation independent of encoder data.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of substrate processing apparatus in accordance with aspects of the disclosed embodiment;

FIGS. 1E and 1F are schematic illustrations of portions of the substrate processing apparatus of FIGS. 1A-1D in accordance with aspects of the disclosed embodiment;

FIG. 12 is a schematic illustration of a portion of the substrate transport apparatus illustrated in FIGS. 2A-2D in accordance with aspects of the disclosed embodiment;

FIG. 13 is schematic illustration of a portion of the substrate transport apparatus illustrated in FIGS. 2A-2D in accordance with aspects of the disclosed embodiment;

FIG. 14 is schematic illustration of a portion of the substrate transport apparatus illustrated in FIGS. 2A-2D in accordance with aspects of the disclosed embodiment;

FIG. 15 is an exemplary graph illustrating use of one or more aspects of the disclosed embodiment compared to conventional methods;

DETAILED DESCRIPTION

Figure 2A:
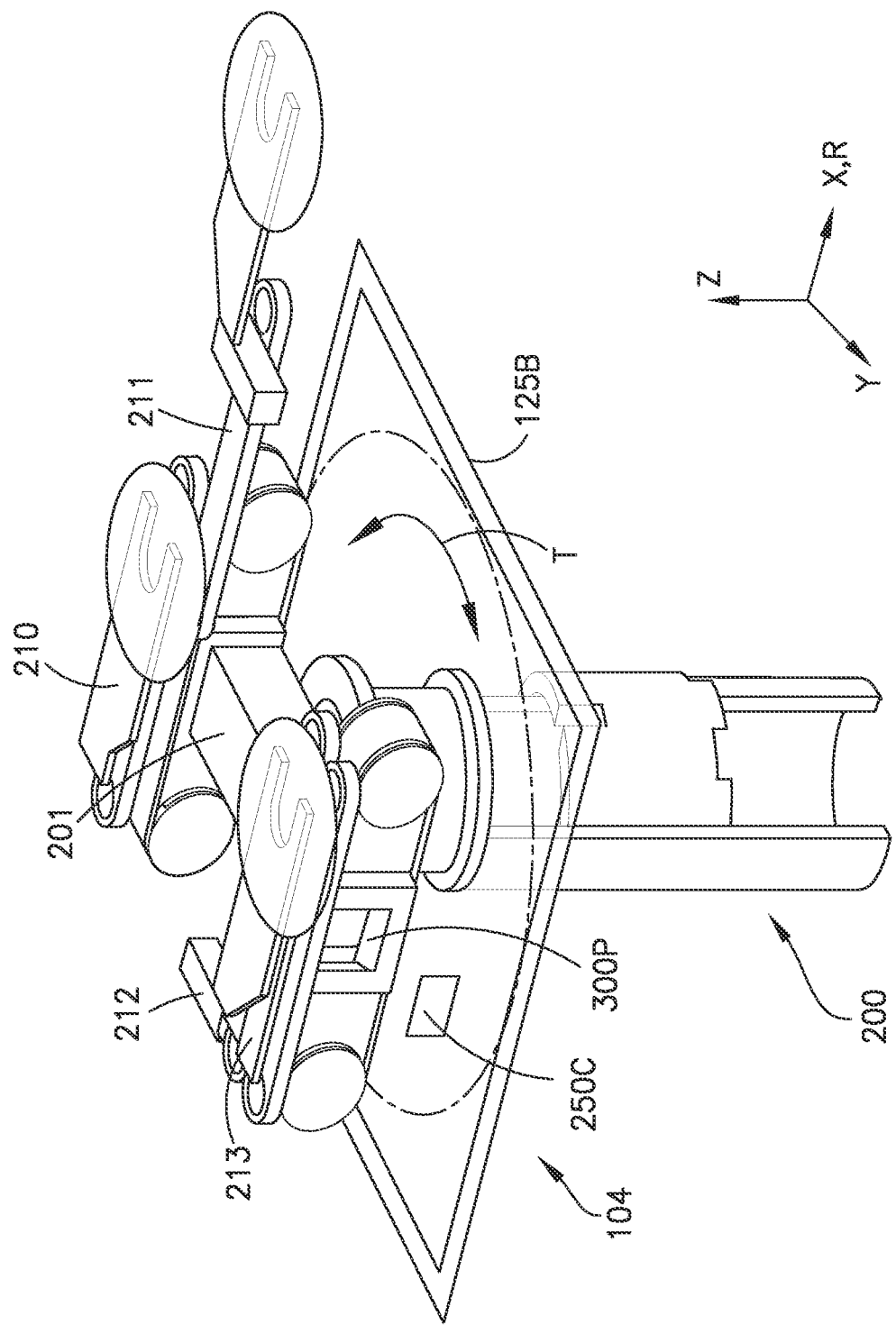
FIGS. 2A-2D are schematic illustrations of a substrate transport apparatus in accordance with aspects of the disclosed embodiment.

FIGS. 1A-1D and 5 are schematic illustrations of substrate processing apparatus in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

As will be described in greater detail below, the aspects of the disclosed embodiment provide for a substrate transport apparatus 125A-D (FIGS. 1A-1D), 510 (FIG. 5) including an imaging system 500 (FIG. 5) for correcting positional errors of at least one robot arm 210, 210A, 211, 211A, 212, 213, 214, 215, 216, 217, 218 of, due to, e.g., thermal effects (expansion/contraction) of the at least one robot arm 210, 210A, 211, 211A, 212, 213, 214, 215, 216, 217, 218. In the aspects of the disclosed embodiment, a camera 501 (FIGS. 8-9) of the imaging system 500 captures a first image 570 (FIG. 10) of at least part 580 (FIG. 6) of the robot arm 210, 210A, 211, 211A, 212, 213, 214, 215, 216, 217, 218 positioned in a predetermined repeatable location 650, 650' (FIG. 6) and compares the first image 570 with a calibration image 590 (FIG. 10) stored in, for example, a controller 110 to determine any positional variances $\Delta_{PV}$ (FIG. 10) between the first image 570 and the calibration image 590. For example, the robot arm 210A, 211A (or any of the other robot arms described herein) of the substrate transport apparatus 125A-D, 510 is factory set or 'zeroed' at the predetermined repeatable position 650, 650' so that the robot arm 210A, 211A may consistently return to the 'zeroed' position for determination of the position variances $\Delta_{PV}$ as will be further described herein.

The substrate processing apparatus 100A, 100B, 100C, 100D, such as for example a semiconductor tool station, is shown in accordance with an aspect of the disclosed embodiment. Although a semiconductor tool station is shown in the drawings, the aspects of the disclosed embodiment described herein can be applied to any tool station or application employing robotic manipulators. In one aspect the processing apparatus 100A, 100B, 100C, 100D are shown as having cluster tool arrangements (e.g. having substrate holding stations connected to a central chamber) while in other aspects the processing apparatus may be a linearly arranged tool, however the aspects of the disclosed embodiment may be applied to any suitable tool station. The apparatus 100A, 100B, 100C, 100D generally include an atmospheric front end 101, at least one vacuum load lock 102, 102A, 102B and a vacuum back end 103. The at least one vacuum load lock 102, 102A, 102B may be coupled to any suitable port(s) or opening(s) of the front end 101 and/or back end 103 in any suitable arrangement. For example, in one aspect the one or more load locks 102, 102A, 102B may be arranged in a common horizontal plane in a side by side arrangement as can be seen in FIGS. 1B-1C. In other aspects the one or more load locks may be arranged in a grid format such that at least two load locks 102A, 102B, 102C, 102D are arranged in rows (e.g. having spaced apart horizontal planes) and columns (e.g. having spaced apart vertical planes) as shown in FIG. 1E. In still other aspects the one or more load lock may be a single in-line load lock 102 as shown in FIG. 1A. In yet another aspect the at least one load lock 102, 102E may be arranged in a stacked in-line arrangement as shown in FIG. 1F. It should be understood that while the load locks are illustrated on end 100E1 or facet 100F1 of a transport chamber 125A, 125B, 125C, 125D in other aspects the one or more load lock may be arranged on any number of sides 10051, 100S2, ends 100E1, 100E2 or facets 100F1-100F8 of the transport chamber 125A, 125B, 125C, 125D. Each of the at least one load lock may also include one or more wafer/substrate resting planes WRP (FIG. 1F) in which substrates are held on suitable supports within the respective load lock. In other aspects, the tool station may have any suitable configuration. The components of each of the front end 101, the at least one load lock 102, 102A, 102B and back end 103 may be connected to a controller 110 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although three load port modules 105 are shown in FIGS. 1A-1D, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates between the substrate cassettes and the mini-environment 106. The mini-environment 106 generally includes any suitable transfer robot 108 which may incorporate one or more aspects of the disclosed embodiment described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The at least one vacuum load lock 102, 102A, 102B may be located between and connected to the mini-environment 106 and the back end 103. In other aspects the load ports 105 may be coupled substantially directly to the at least one load lock 102, 102A, 102B or the transport chamber 125A, 125B, 125C, 125D where the substrate carrier C is pumped down to a vacuum of the transport chamber 125A, 125B, 125C, 125D and substrates are transferred directly between the substrate carrier C and the load lock or transfer chamber. In this aspect, the substrate carrier C may function as a load lock such that a processing vacuum of the transport chamber extends into the substrate carrier C. As may be realized, where the substrate carrier C is coupled substantially directly to the load lock through a suitable load port any suitable transfer apparatus may be provided within the load lock or otherwise have access to the carrier C for transferring substrates to and from the substrate carrier C. It is noted that the term vacuum as used herein may denote a high vacuum such as 10-5 Torr or below in which the substrates are processed. The at least one load lock 102, 102A, 102B generally includes atmospheric and vacuum slot valves. The slot valves of the load locks 102, 102A, 102B (as well as for the substrate station modules 130) may provide the environmental isolation employed to evacuate the load lock after loading a substrate from the atmospheric front end and to maintain the vacuum in the transport chamber when venting the lock with an inert gas such as nitrogen. As will be described herein, the slot valves of the processing apparatus 100A, 100B, 100C, 100D may be located in the same plane, different vertically stacked planes or a combination of slot valves located in the same plane and slot valves located in different vertically stacked planes (as described above with respect to the load ports) to accommodate transfer of substrates to and from at least the substrate station modules 130 and load locks 102, 102A, 102B coupled to the transport chamber 125A, 125B, 125C, 125D. The at least one load lock 102, 102A, 102B (and/or the front end 101) may also include an aligner for aligning a fiducial of the substrate to a desired position for processing or any other suitable substrate metrology equipment. In other aspects, the vacuum load lock may be located in any suitable location of the processing apparatus and have any suitable configuration.

The vacuum back end 103 generally includes a transport chamber 125A, 125B, 125C, 125D, one or more substrate station modules 130 and any suitable number of substrate transfer robots 104 that includes one or more transfer robots and may include one or more aspects of the disclosed embodiments described herein. The transport chamber 125A, 125B, 125C, 125D may have any suitable shape and size that, for example, complies with SEMI standard E72 guidelines. The substrate transfer robot 104 and the one or more transfer robot will be described below and may be located at least partly within the transport chamber 125A, 125B, 125C, 125D to transport substrates between the load lock 102, 102A, 102B (or between a cassette C located at a load port) and the various substrate station modules 130. In one aspect the substrate transfer robot 104 may be removable from the transport chamber 125A, 125B, 125C, 125D as a modular unit such that the substrate transfer robot 104 complies with SEMI standard E72 guidelines.

The substrate station modules 130 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The substrate station modules 130 are communicably connected to the transport chamber 125A, 125B, 125C, 125D in any suitable manner, such as through slot valves SV, to allow substrates to be passed from the transport chamber 125 to the substrate station modules 130 and vice versa. The slot valves SV of the transport chamber 125 may be arranged to allow for the connection of twin (e.g. more than one substrate processing chamber located within a common housing) or side-by-side substrate station modules 130T1, 130T2, single substrate station modules 130S and/or stacked process modules/load locks (FIGS. 1E and 1F).

It is noted that the transfer of substrates to and from the substrate station modules 130, load locks 102, 102A, 102B (or cassette C) coupled to the transfer chamber 125A, 125B, 125C, 125D may occur when one or more arms of the substrate transfer robot 104 are aligned with a predetermined substrate station module 130. In accordance with aspects of the disclosed embodiment one or more substrates may be transferred to a respective predetermined substrate station module 130 individually or substantially simultaneously (e.g. such as when substrates are picked/placed from side-by-side or tandem processing stations as shown in FIGS. 1B, 1C and 1D. In one aspect the substrate transfer robot 104 may be mounted on a boom arm 143 (see e.g. FIG. 1D) or linear carriage 144 such as that described in U.S. provisional patent application No. 61/892,849 entitled "Processing Apparatus" and filed on Oct. 18, 2013 and 61/904,908 entitled "Processing Apparatus" and filed on Nov. 15, 2013 and International patent application number PCT/US13/25513 entitled "Substrate Processing Apparatus" and filed on Feb. 11, 2013, the disclosures of which are incorporated herein by reference in their entireties.

Figure 2B:
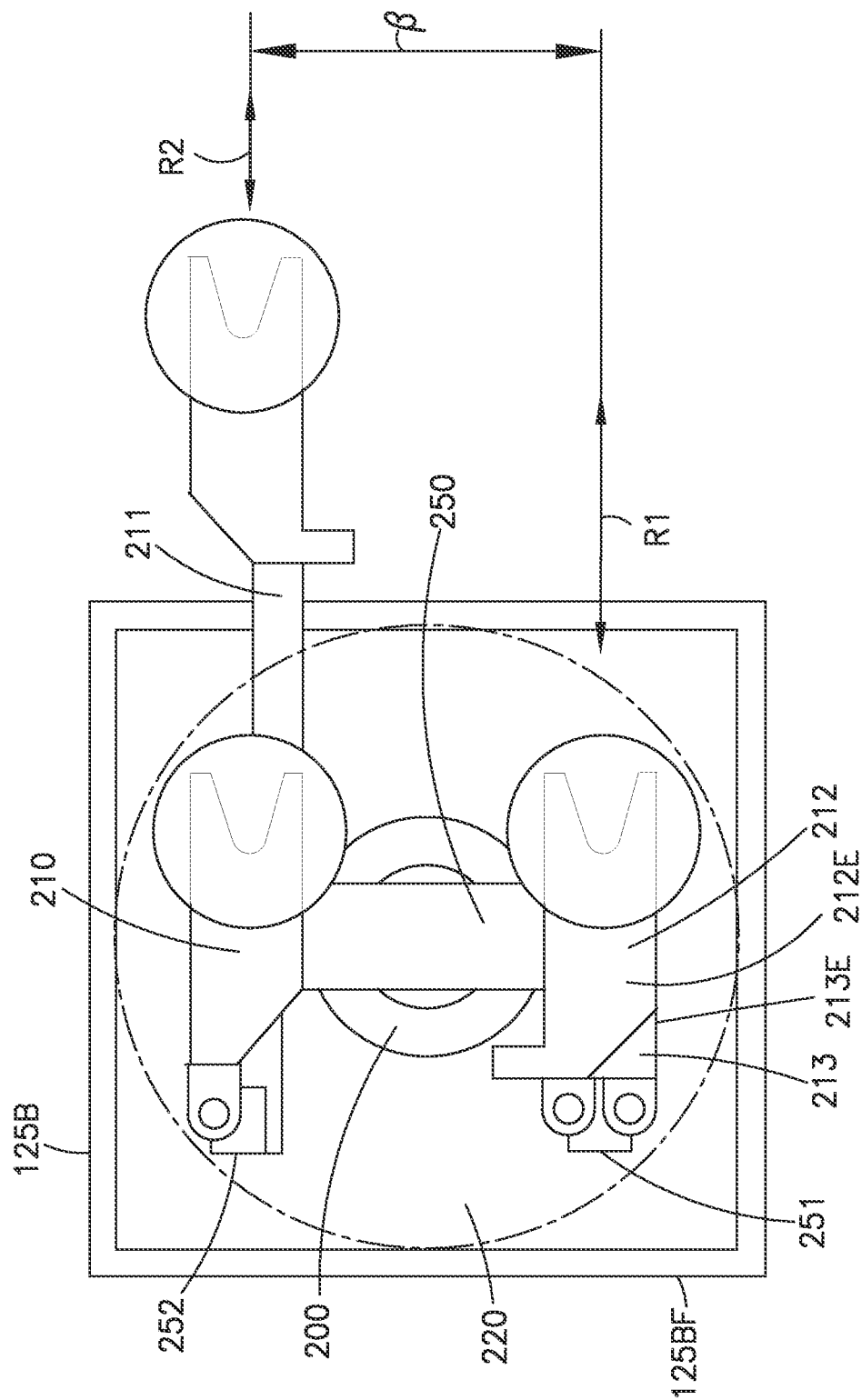
Figure 2C:
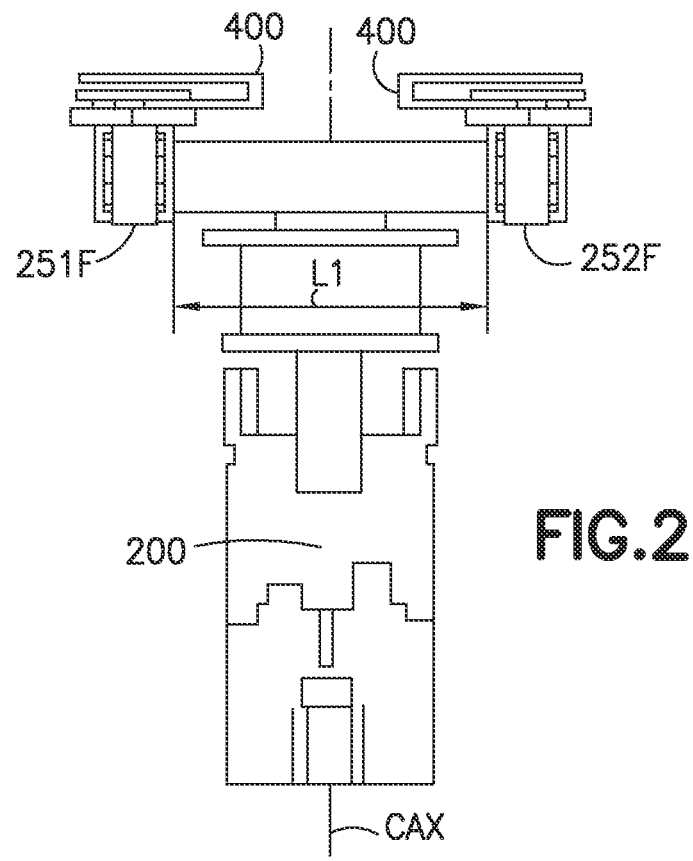
Figure 2D:
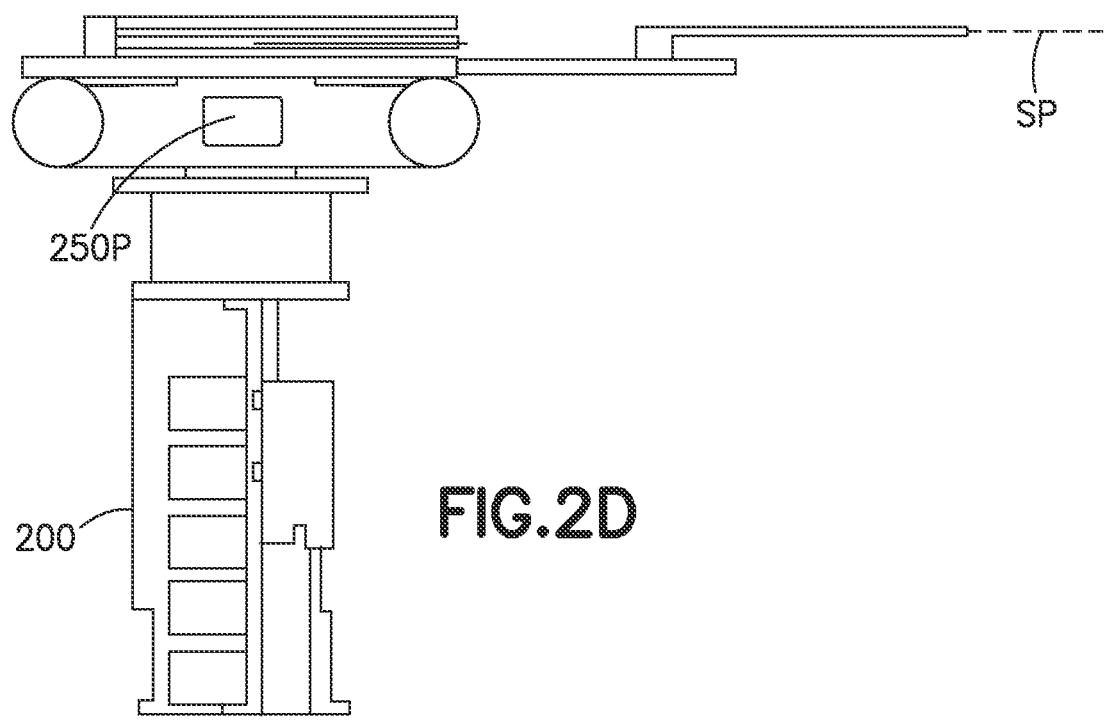
Figure 2E:
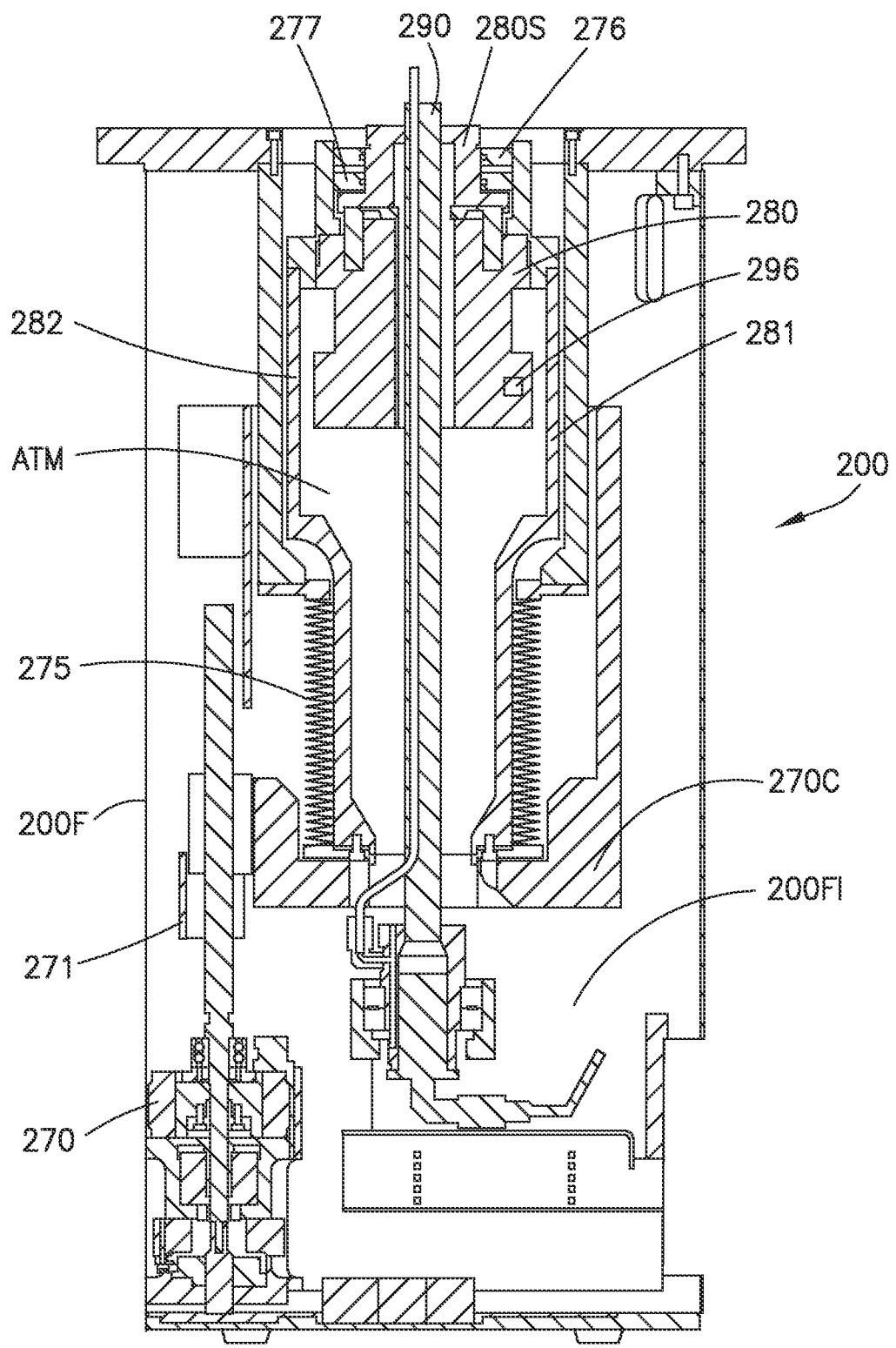
FIG. 2E is a schematic illustration of a drive section in accordance with aspects of the disclosed embodiment.

Referring now to FIGS. 2A-2D, in one aspect the substrate transfer robot 104 includes at least one drive section 200, 201 and at least one robot arm 210, 211, 212, 213. It is noted that the substrate transfer robot 104 illustrated is exemplary and in other aspects may have any suitable configuration substantially similar to that described in U.S. application. Ser. No. 14/568,742 entitled "Substrate transport apparatus" and filed on Dec. 12, 2014, the disclosure of which is incorporated by reference herein in its entirety. The at least one drive section 200, 201 may include a common drive section 200 that includes a frame 200F that houses one or more of a Z axis drive 270 and a rotational drive section 282. An interior 200FI of the frame 200F may be sealed in any suitable manner as will be described below. In one aspect the Z axis drive may be any suitable drive configured to move the at least one robot arm 210, 211, 212, 213 along the Z axis. The Z axis drive is illustrated in FIG. 2E as a screw type drive but in other aspects the drive may be any suitable linear drive such as a linear actuator, piezo motor, etc. The rotational drive section 282 may be configured as any suitable drive section such as, for example, a harmonic drive section, a direct drive section, etc. In one aspect the rotational drive section 282 shown in FIG. 2E includes one harmonic drive motor 280 for driving shaft 280S however, in other aspects the drive section may include any suitable number of harmonic drive motors corresponding to, for example, any suitable number of drive shafts in the coaxial drive system. If the drive section 282 is a direct drive configuration, no harmonic drive is included in the drive section, in this example the rotational drive section 282 includes a housing 281 that houses the drive motor 280 in a manner substantially similar to that described in U.S. Pat. Nos. 6,845,250; 5,899,658; 5,813,823; and 5,720,590, the disclosures of which are incorporated by reference herein in their entireties. It is noted that drive shaft 280S may also have a hollow construction (e.g. has a hole running longitudinally along a center of the drive shaft) to allow for the passage of wires 290 or any other suitable items through the drive assembly for connection to, for example, another drive section (e.g. such as drive section 201) and/or the at least one robot arm 210, 211, 212, 213, mounted to the drive 200.

Figure 2F:
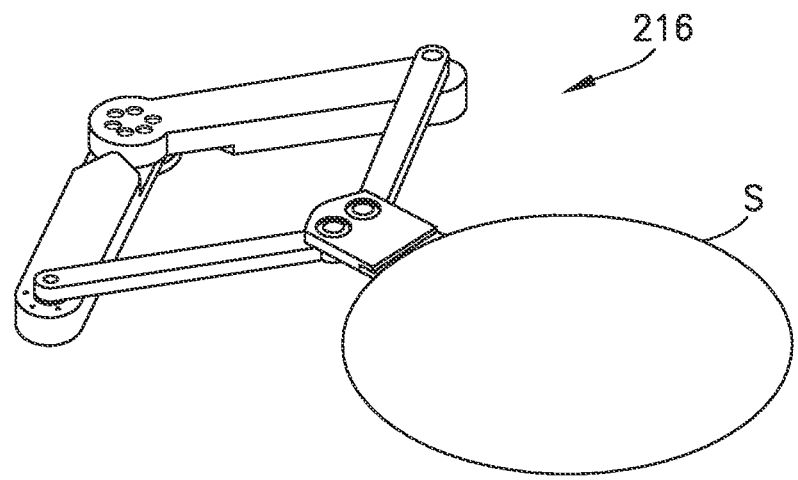
FIGS. 2F-2J are schematic illustrations of transport arms in accordance with aspects of the disclosed embodiment.
Figure 2G:
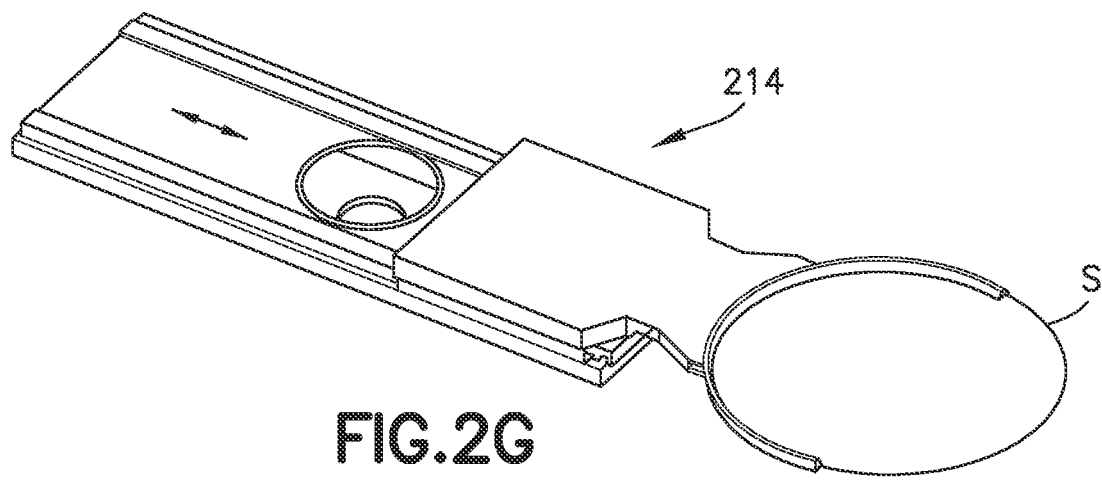
Figure 2H:
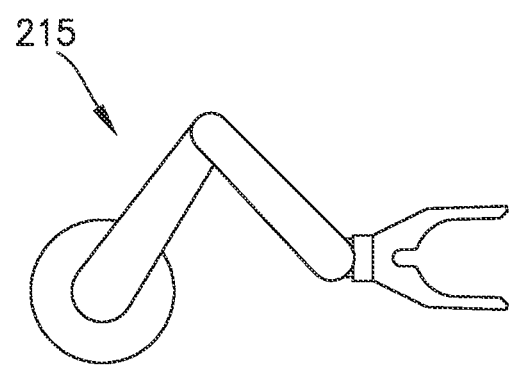
Figure 2I:
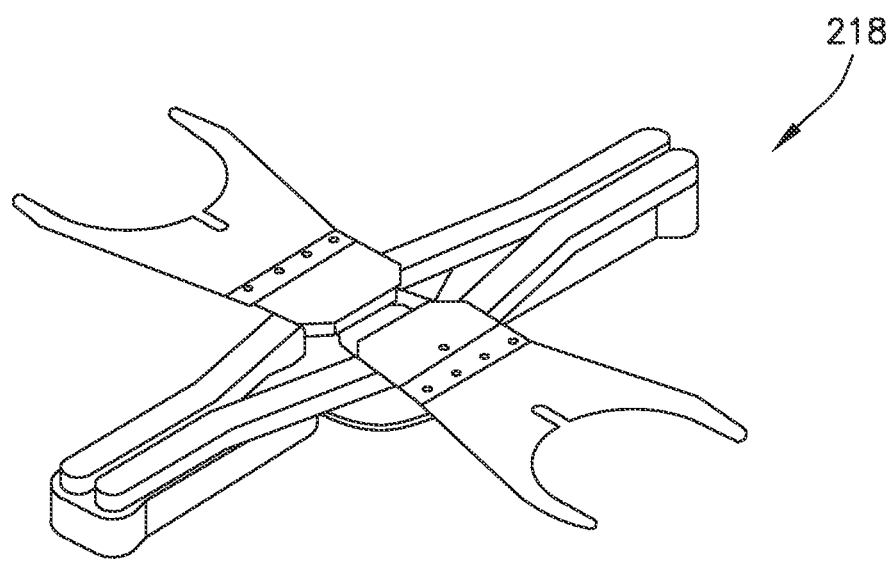
Figure 2J:
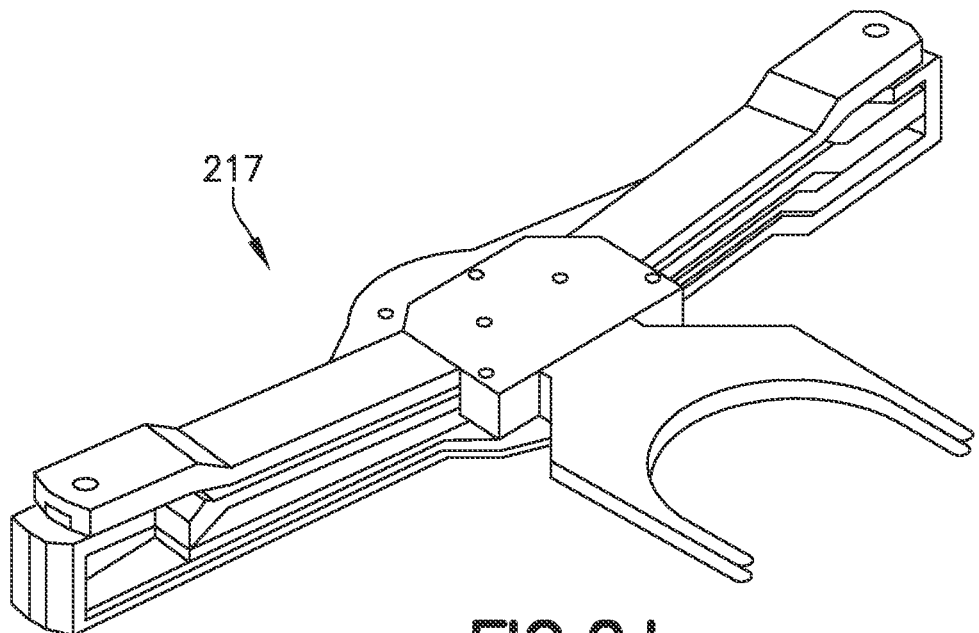
Figure 2K:
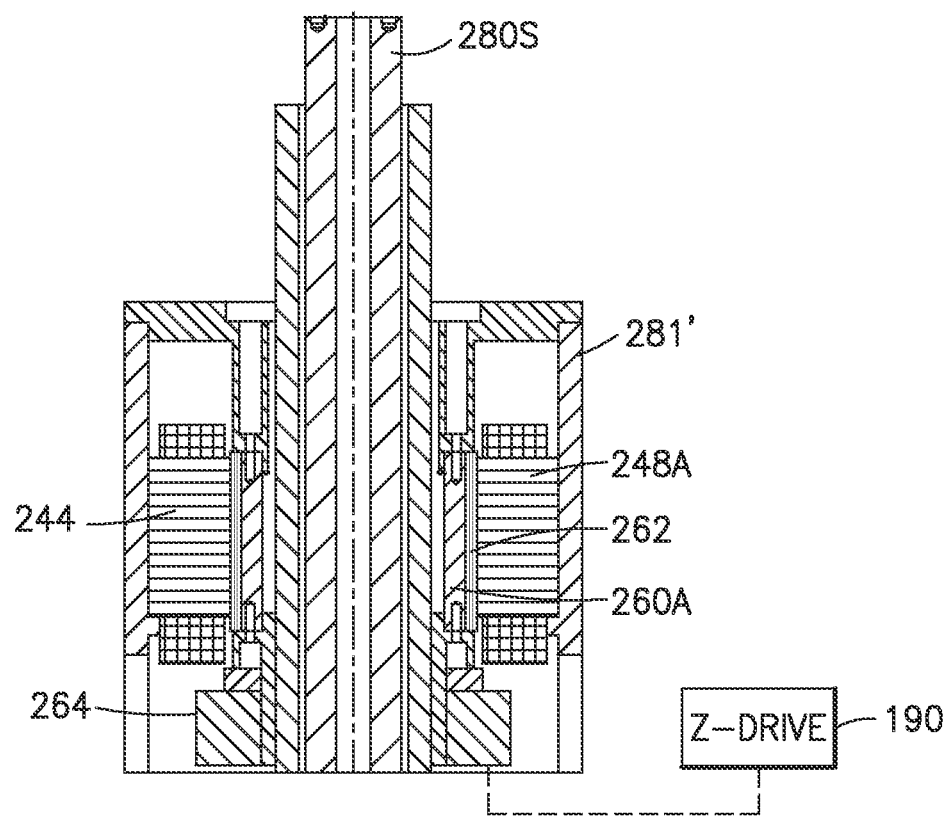
FIG. 2K is a schematic illustration of a drive section in accordance with aspects of the disclosed embodiment.

In another aspect, referring to FIG. 2K, the drive section 282' may be a direct drive system having one or more degrees of freedom for driving any suitable drive shafts of the substrate transport robot 104. In one aspect, the drive section 282', for example may be a one axis (e.g. one degree of freedom) drive section or may include any suitable number of drive axes. In one aspect, the drive section 282' generally comprises a motor 244 for driving the drive shaft 280S. As may be realized the drive system may not be limited to one motor. The motor 244 comprises a stator 248A and a rotor 260A connected to the drive shaft 280S. The stator 248A is stationarily attached to the housing 281'. The stator 248A generally comprises an electromagnetic coil. The rotor 260A is comprised of permanent magnets, but may alternatively comprise a magnetic induction rotor that does not have permanent magnets. A sleeve or thin can seal 262 is located, if desired, between the rotor 260A and the respective stator 248A to seal the stator 248A from an operational environment in which the at least one robot arm 210, 211, 212, 213 operates. However, the sleeve 262 need not be provided if the transport apparatus robot 104 is intended for use in an atmospheric environment. In one aspect, the drive shaft 280S may be provided with a position sensor 264 (e.g., a position encoder). The position sensor 264 is used to signal the controller 110 of the rotational position of the shaft 280S relative to, e.g., the frame 281'. Any suitable sensor could be used, such as optical or induction. The drive section 282' may also include one or more suitable Z-axis drive 190 to drive at least one robot arm 210, 211, 212, 213 in a direction substantially parallel with (e.g. along) the shoulder axis as a unit.

While the motors are illustrated as rotary motors in other aspects any suitable motor(s) and/or suitable drive transmission(s) may be used such as, for example, a direct drive linear motor, linear piezo electric motors, linear inductance motors, linear synchronous motors, brushed or brushless linear motors, linear stepper motors, linear servo motors, reluctance motors, etc. Examples of suitable linear motors are described in, for example, U.S. patent application Ser. No. 13/286,186 entitled "Linear Vacuum Robot with Z Motion and Articulated Arm" filed on Oct. 31, 2011; Ser. No. 13/159,034 entitled "Substrate Processing Apparatus" filed on Jun. 13, 2011 and U.S. Pat. No. 7,901,539 entitled "Apparatus and Methods for Transporting and Processing Substrates" issued Mar. 8, 2011; U.S. Pat. No. 8,293,066 entitled "Apparatus and Methods for Transporting and Processing Substrates" issued Oct. 23, 2012; U.S. Pat. No. 8,419,341 entitled "Linear Vacuum Robot with Z Motion and Articulated Arm" issued Apr. 16, 2013; U.S. Pat. No. 7,575,406 entitled "Substrate Processing Apparatus" issued Aug. 18, 2009; and U.S. Pat. No. 7,959,395 entitled "Substrate Processing Apparatus" issued Jun. 14, 2011, the disclosures of which are incorporated herein by reference in their entireties.

In one aspect the housing 281, 281' may be mounted to a carriage 270C which is coupled to the Z axis drive 270 such that the Z axis drive moves the carriage (and the housing 281 located thereon) along the Z axis. As may be realized, to seal the controlled atmosphere in which the at least one robot arm 210, 211, 212, 213 operates from an interior of the drive 200 (which may operate in an atmospheric pressure ATM environment) the drive motor 280 may include one or more of the ferrofluidic seal 276, 277 and a bellows seal 275. The bellows seal 275 may have one end coupled to the carriage 270C and another end coupled to any suitable portion of the frame 200FI so that the interior 200FI of the frame 200F is isolated from the controlled atmosphere in which the at least one robot arm 210, 211, 212, 213 operates.

In this aspect the drive shaft 280S may be coupled to the drive section 201 for rotating the drive section 201 in the direction of arrow T about a common axis CAX that may be common to each of the at least one robot arm 210, 211, 212, 213. Here the drive section 201 may include a base member 250 and at least one drive portion 251, 252. In this aspect there are two drive portions 251, 252 but in other aspects any suitable number of drive portions may be provided. The base member 250 includes a frame that forms an interior chamber 250P. Each drive portion 251, 252 also includes a frame 251F, 252F that forms an interior chamber 300P that is in sealed communication with the interior chamber 250P of the base member 250. As may be realized, each drive portion 251, 252 may include any suitable access opening that may be sealed by, for example, any suitable cover 250C. As can be seen in FIG. 2B the base member 250 may include a first and second ends such that a drive portion 251, 252 is sealingly coupled to a respective one of the ends. The drive portions may be arranged at any suitable angle 3 (or pitch) relative to one another so that an extension/retraction axis of the arm(s) mounted thereon are capable of extending through ports of the transfer chambers 125A, 125B, 125C, 125D in which the arm(s) are located. For example, in one aspect the angle 3 (which may correspond to an angle/pitch between the extension/retraction axes of the drive portions 251, 252) may be substantially the same as or equal to the angle α of the facets 100F1-100F8 of transfer chamber 125A (FIG. 1A). In other aspects the angle 3 may be about 0° so that the axes of extension/retraction of the drive portions (and the arm(s) mounted thereon) are substantially parallel to one another for extending through the side-by-side ports of, e.g., transfer chambers 125B (FIG. 1B), 125C (FIG. 1C) and 125D (FIG. 1D). In still other aspects the angle β may be adjustable (either manually or through automation, as will be described below) so that the axes of extension/retraction of the drive portion 251, 252 may have any suitable angle β relative to one another. For example, the angle β may be adjusted between an angle of 0° and θ for extending through ports of the transfer chamber 125C (FIG. 1C) and/or for automatic workpiece centering as will be described below. In yet other aspects the angle β and/or spacing (pitch) PT, see FIG. 1C between the drive portions may be fixed such that the arms of the substrate transfer robot 104 may extend through the ports of the transfer modules having angled facets through a rotation of the common drive axes CAX and independent extension or operation of each drive portion 251, 252. The base member 250 may have any suitable length L1 so that the axes of extension and retraction R1, R2 of each drive portion 251, 252 are a fixed distance apart where the fixed distance may correspond or otherwise match requirements (e.g. the distance between ports of a module in which the substrate transfer robot 104 is located) imposed by the system tool configuration.

Referring also to FIGS. 3A-3G drive portion 251, 252 will be described with respect to drive portion 251. It should be understood that drive portion 252 may be substantially similar to drive portion 251. As noted above, drive portion 251 includes a frame 251F that may be constructed of a first frame member 251F1 and a second frame member 251F2 that are sealingly coupled to each other in any suitable manner. In other aspects the frame may have any suitable configuration and be composed of any suitable number of frame members. The frame 251F may include an aperture or opening 251M configured for mounting the frame 251F to the base member 250 in any suitable manner so that an interior chamber 300P of the drive portion 251 is in sealed communication with an interior chamber 250P of the base member 250 so that a common atmospheric environment is shared between the interior chambers 250P, 300P and the interior of housing 281 of drive section 200. In this aspect the drive portion 251 may be configured to support and drive two robot arms 212, 213 but in other aspects the drive portion 251 may be configured to support and drive any suitable number of robot arms. The drive portion 251 may include a first linear rail or slide 310A, 310B (generally linear rail or slide 310) and a second linear rail or slide 311A, 311B (generally linear rail or slide 311) configured to define a degree of freedom for the independent drive axis that extends and retracts each of the respective robot arms 212, 213. In this aspect the drive portion includes a first drive motor 320 and a second drive motor 321 for driving a respective arm 212, 213 through, for example, a band and pulley drive transmission.

The first and second drive motors 320, 321 (FIGS. 3D and 3E) may be harmonic or direct drives substantially similar to drive motor 280 while in other aspects the drive motors 320, 321 may be any suitable drive motors. Each drive motor 320, 321 may have a respective seal 320S, 321S, such as a ferrofluidic seal for sealing an aperture in the frame 251 through which a drive shaft 370 of the motor 320, 321 extends for coupling, in any suitable manner, to a respective drive pulley 332B, 333A. The drive pulley 332B, 333A may be coupled to a respective driven pulley 332A, 333B in any suitable manner such as by one or more bands. For example, drive pulley 332B may be coupled to driven pulley 332A by bands 330A, 330B. Drive pulley 333A may be coupled to driven pulley 333B by bands 331A, 333B. The bands 330A, 330B, 331A, 331B may be any suitable bands such as, for example, those described in, for example, U.S. provisional patent application No. 61/869,870 entitled "Substrate Transport Apparatus" and filed on Aug. 26, 2013 the disclosure of which is incorporated herein by reference in its entirety. As may be realized, the drive axes described herein may have any suitable encoders, such as encoders 296, 371 for detecting a position of a respective drive motor and sending one or more signals to any suitable controller such as, for example, controller 110 for controlling the substrate transfer robot 104. As may also be realized, the sealed interior of the drive portions 251, 252 and base member 250 allow the drive motors 320, 321 of each drive portion 251, 252 to be located in an atmospheric environment separated or otherwise sealed from an environment in which the robot arms 210-213 operate. The sealed interior of the drive portions 251, 252 and base member 250 also may allow for wire or hose routing from the drive section 200 to the drive section 201. In such aspects where the robot arms and drive sections are all located in atmospheric environment, such as an atmospheric module, as described previously, the drive interior may not be sealed.

Referring to again to FIGS. 2A-2D and 4A-4B the robot arms 210-213 will be described with respect to drive portion 252 in accordance with aspects of the disclosed embodiment. In this aspect the robot arms 210-213 have a telescoping configuration but in other aspects the robot arms 210-213 may have any suitable configuration. Also in this aspect each drive portion 251, 252 includes two telescoping arms 210-213 but in other aspects any suitable number of robot arms may be provided on each drive portion 251, 252. In this aspect each robot arm 210-213 includes a base member 210B, 211B and an end effector 210E, 211E movably coupled to a respective base member 210B, 211B. Each base member 210B, 211B may have an interior in which any suitable transmission may be disposed for driving the end effector along the axis of extension/retraction. It is noted that each end effector described herein includes an end effector seating plane SP (FIG. 2D) in which a substrate is located when being held by the end effector. Base member 210B may be movably coupled to the drive portion 252 through the linear rails 310A, 310B of the so as to be movable relative to the drive portion 252. Base member 211B may be coupled to the drive portion 252 through the linear rails 311A, 311B so as to be movable relative to the drive portion 252. Each arm 210, 211 has a degree of freedom defined by the respective rails such that the degrees of freedom for each of the robot arms 210 and 211 defined by the linear rails are parallel to one another (e.g. the transfer plane of the end effectors are located one above the other). As may be realized, robot arms 212, 213 have similar parallel degrees of freedom. As may also be realized, the degree of freedom defined by the linear rails for arm 211 may be coplanar with the degree of freedom defined by the linear rails for robot arm 212 (e.g. the end effectors of each robot arm 211, 212 are located in the same plane) while the degree of freedom defined by the linear rails for arm 210 may be coplanar with the degree of freedom defined by the linear rails for robot arm 213 (e.g. the end effectors of each robot arm 210, 213 are located in the same plane).

The base members 210B, 211B may be disposed side-by-side on the drive portion 252 so that base member 210B is coupled to at least one of the bands 330A, 330B so that as the bands 330A, 330B are driven by the motor 320 the base member 210B moves with at least one of the bands 330A, 330B in the direction of extension/retraction R. Base member 211B is coupled to at least one of the bands 331A, 331B so that as the bands 331A, 331B are driven by the motor 321 the base member 211B moves with at least one of the bands 331A, 331B in the direction of extension/retraction R. In other aspects the base members may have any suitable spatial arrangement relative to each other.

Base member 210B may include a linear rail or slide 410A, 410B disposed at least partly within the interior of the base member to which the end effector 210E is movably mounted for relative rotation to the base member 210B and the drive portion 252. Pulleys 410, 411, 420, 421 may be rotatably mounted at the ends or at any other suitable location within the interior of a respective base member 210B, 211B. One or more bands (similar to those described above), a single continuous loop band/belt or any other suitable transmission member 412, 422 may couple respective ones of the pulleys 410, 411, 420, 421 to each other. In one aspect each transmission member 412, 422 may be grounded to frame 252F of the drive portion 252 so that relative movement between the base member 210B, 211B and the frame 252F drives a respective transmission member 412, 422. The end effector 211E may be coupled to the transmission member 412 so that as the base member 211B moves in the direction of arrow R the end effector also moves in the direction of arrow R relative to the base member 211B by any suitable drive ratio defined by, for example, the pulleys 410, 411. Similarly, the end effector 210E may be coupled to the transmission member 412 so that as the base member 210B moves in the direction of arrow R the end effector also moves in the direction of arrow R relative to the base member 210B by any suitable drive ratio defined by, for example, the pulleys 420, 421. As may be realized, a bridge member 400 may be provided on one of the end effectors, such as end effectors, 211E, 212E so that the end effector 211E, 212E can be positioned above the other end effector 210E, 213E of a respective drive portion 251, 252 while allowing the end effectors to pass over/under one another.

As noted above, the robot arms described herein are illustrated as telescoping arms (or sliding arms as described below) for exemplary purposes. However, in other aspects the robot arms may be any suitable robot arm such as, for a linearly sliding arm 214 as shown in FIG. 2G. In other aspects the arms may be a SCARA arm 215 (FIG. 2H) or other suitable arm having any suitable arm linkage mechanisms. Suitable examples of arm linkage mechanisms can be found in, for example, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011, U.S. Pat. No. 8,419,341 issued Apr. 16, 2013 and U.S. patent application Ser. No. 13/293,717 entitled "Dual Arm Robot" and filed on Nov. 10, 2011 and Ser. No. 13/861,693 entitled "Linear Vacuum Robot with Z Motion and Articulated Arm" and filed on Sep. 5, 2013 the disclosures of which are all incorporated by reference herein in their entireties. In aspects of the disclosed embodiment, the at least one robot arm may be derived from a conventional SCARA (selective compliant articulated robot arm) type design, which includes an upper arm, a band-driven forearm and a band-constrained end-effector, or from a telescoping arm or any other suitable arm design. Suitable examples of robot arms can be found in, for example, U.S. patent application Ser. No. 12/117,415 entitled "Substrate Transport Apparatus with Multiple Movable Arms Utilizing a Mechanical Switch Mechanism" filed on May 8, 2008 and U.S. Pat. No. 7,648,327 issued on Jan. 19, 2010, the disclosures of which are incorporated by reference herein in their entireties. The operation of the robot arms may be independent from each other (e.g. the extension/retraction of each arm is independent from other arms), may be operated through a lost motion switch or may be operably linked in any suitable way such that the arms share at least one common drive axis. In still other aspects the transport arms may have any other desired arrangement such as a frog-leg arm 216 (FIG. 2F) configuration, a leap frog arm 217 (FIG. 2J) configuration, a bi-symmetric arm 218 (FIG. 2I) configuration, etc. Suitable examples of transport arms can be found in U.S. Pat. No. 6,231,297 issued May 15, 2001, U.S. Pat. No. 5,180,276 issued Jan. 19, 1993, U.S. Pat. No. 6,464,448 issued Oct. 15, 2002, U.S. Pat. No. 6,224,319 issued May 1, 2001, U.S. Pat. No. 5,447,409 issued Sep. 5, 1995, U.S. Pat. No. 7,578,649 issued Aug. 25, 2009, U.S. Pat. No. 5,794,487 issued Aug. 18, 1998, U.S. Pat. No. 7,946,800 issued May 24, 2011, U.S. Pat. No. 6,485,250 issued Nov. 26, 2002, U.S. Pat. No. 7,891,935 issued Feb. 22, 2011 and U.S. patent application Ser. No. 13/293,717 entitled "Dual Arm Robot" and filed on Nov. 10, 2011 and Ser. No. 13/270,844 entitled "Coaxial Drive Vacuum Robot" and filed on Oct. 11, 2011 the disclosures of which are all incorporated by reference herein in their entireties.

Figure 5:
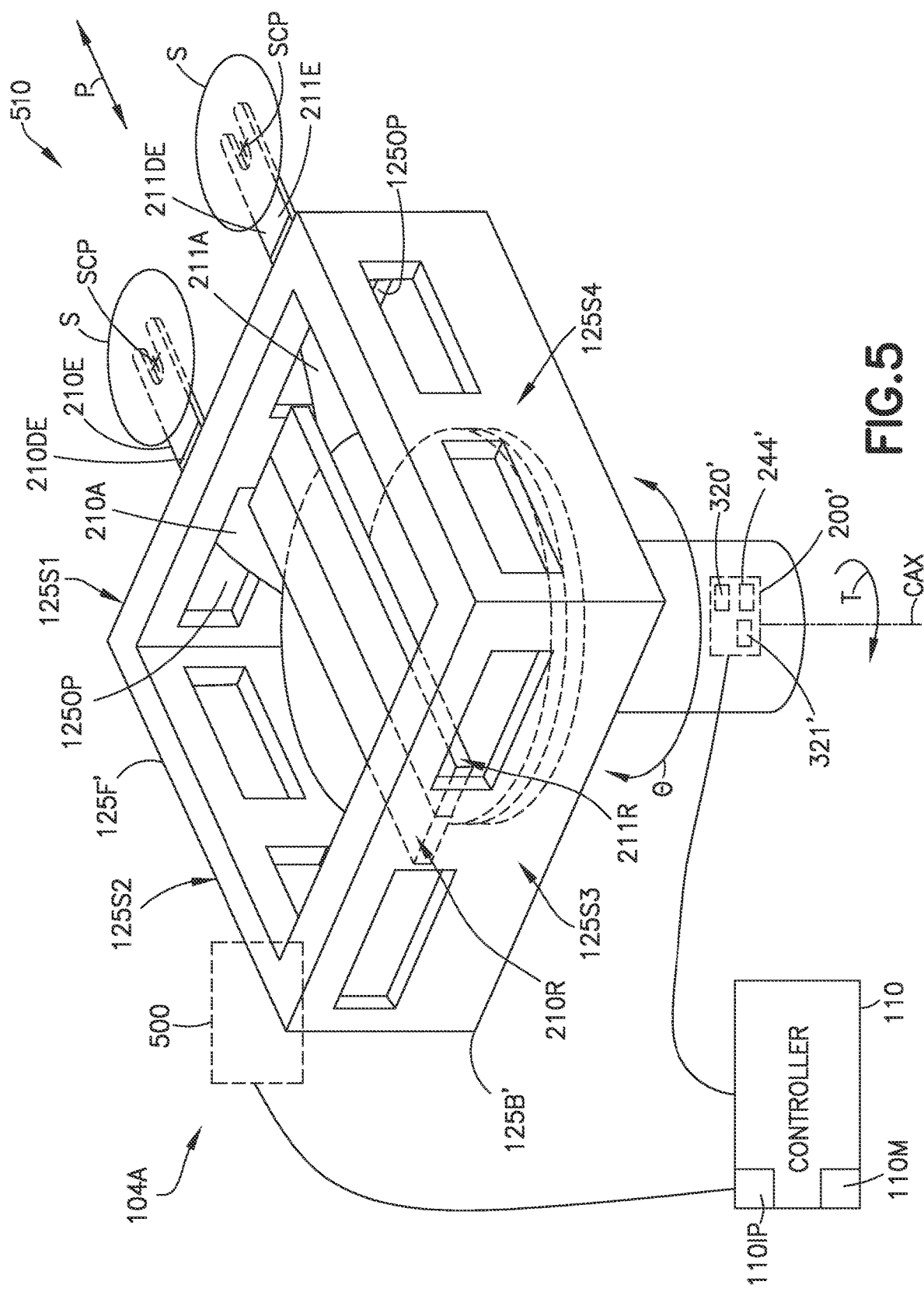
FIG. 5 is a schematic illustration of a portion of the substrate transport apparatus illustrated in FIGS. 2A-2D in accordance with aspects of the disclosed embodiment.

Referring now to FIG. 5, an exemplary substrate transport apparatus 510 is illustrated in accordance with aspects of the disclosed embodiment. The substrate transport apparatus 510 is substantially similar to the substrate transport apparatus 125A-D described above with respect to FIGS. 2A-4B and may include one or more of the arm configurations described above. The substrate transport apparatus 510 may be employed in any suitable atmospheric or vacuum environment such as those described above with respect to the processing apparatus 100A, 100B, 100C, 100D. As can be seen in FIG. 5, in one aspect the substrate transport apparatus 510 includes a transport chamber 125B' and a substrate transport robot 104A (substantially similar to the substrate transport robot 104 described above) at least partially disposed in the transport chamber 125B'. The transport chamber 125B' includes at least one substrate transport opening 1250P (on at least one side 125S1-S4 of the transport chamber 125B'), and at least one robot arm 210A, 211A that has at least one end effector 210E, 211E disposed at a distal end 210DE, 211DE of the robot arm 210A, 211A. Any suitable controller, such as controller 110 described above, may be connected to drive section 200' of the substrate transport apparatus 510 and includes a controller module 110M having any suitable non-transitory program code for effecting operation of the substrate transport apparatus 510 as described herein. The at least one robot arm 210A, 211A is shown holding a substrate S thereon for transporting the substrate S along a transport path P in radial direction R to, e.g., substrate station module 130 (FIG. 1A). As described herein, thermal effects, such as expansion, contraction, twisting, drooping/sagging on the at least one robot arm 210A, 211A and other variability in the robot performance (e.g., caused from manufacturing variability, wear of robot components, robot component shift, hysteresis, etc.) may be a source of accuracy errors in, for example the placement and picking of substrates S from any suitable substrate holding station, such as substrate station module 130. The thermal effects and the other variabilities of, for example, the at least one robot arm 210A, 211A may be compensated for, with positional data provided by or derived from the imaging system 500 to effect motion compensation for at least substrate S placement in, e.g., the substrate station module 130 or at any other suitable substrate holding station.

Figure 3A:
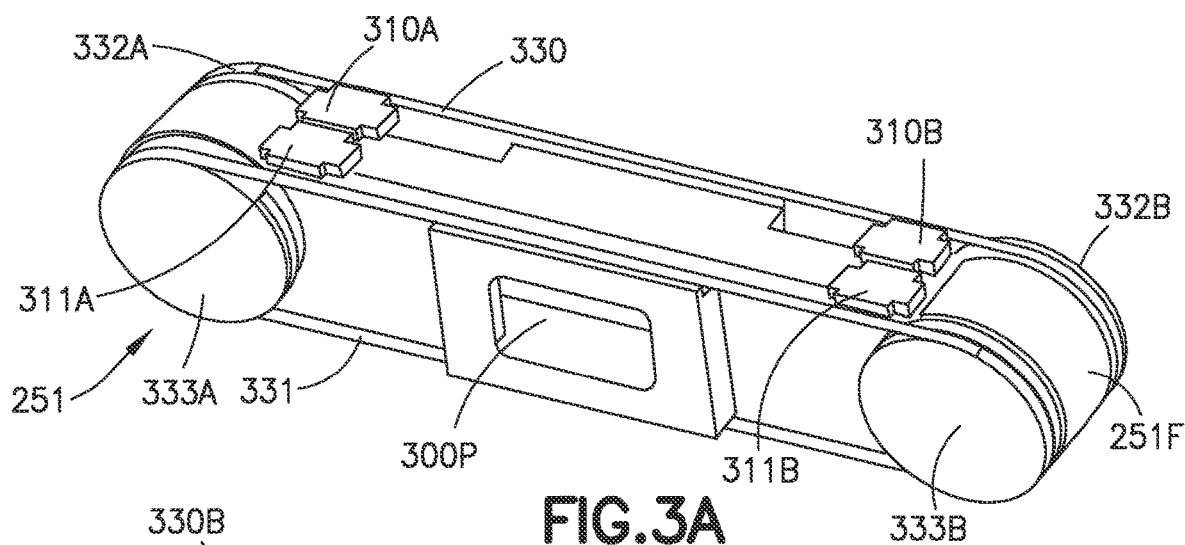
FIGS. 3A-3E are schematic illustrations of a portion of the substrate transport apparatus illustrated in FIGS. 2A-2D in accordance with aspects of the disclosed embodiment.
Figure 3B:
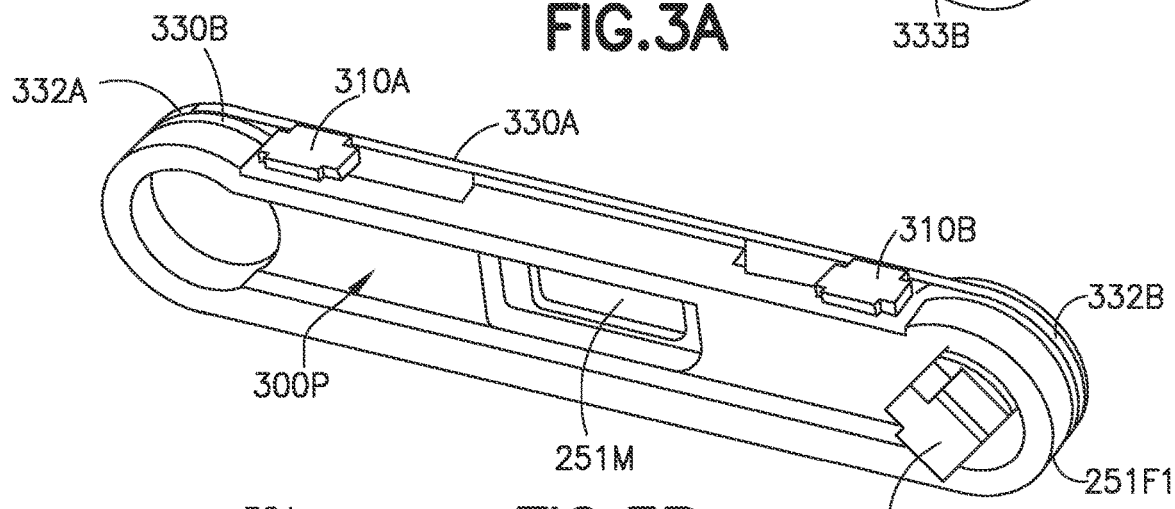
Figure 3C:
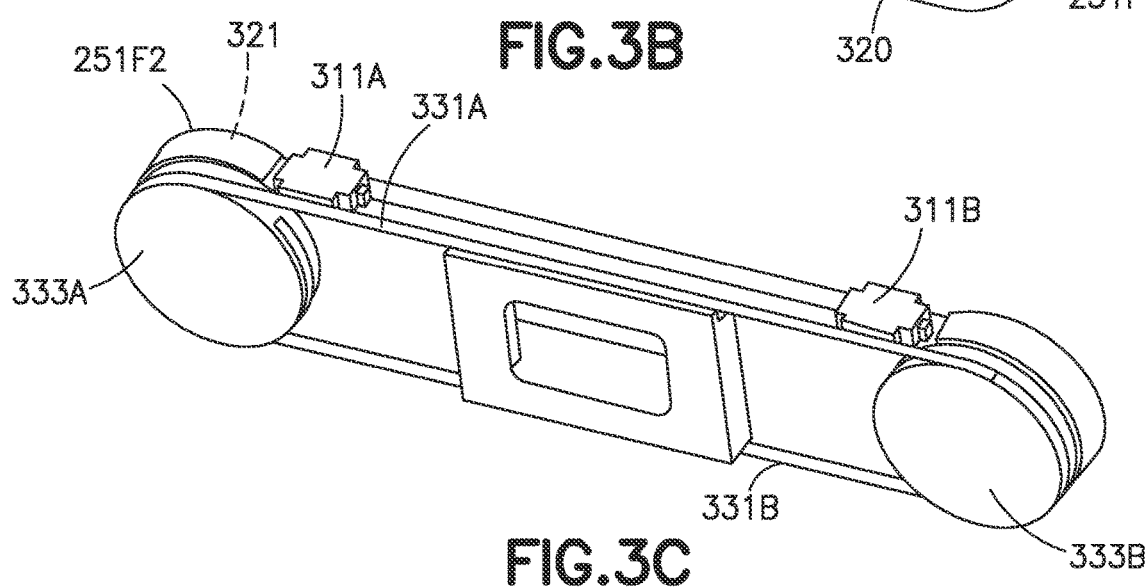
Figure 3D:
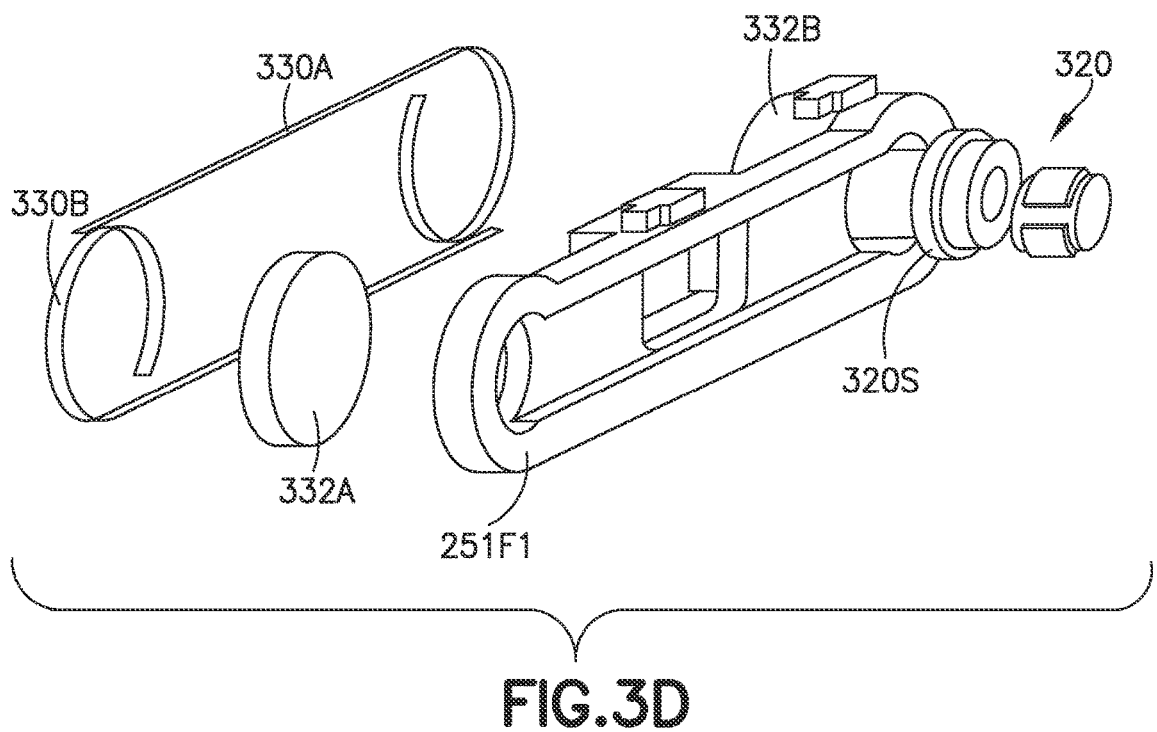
Figure 3E:
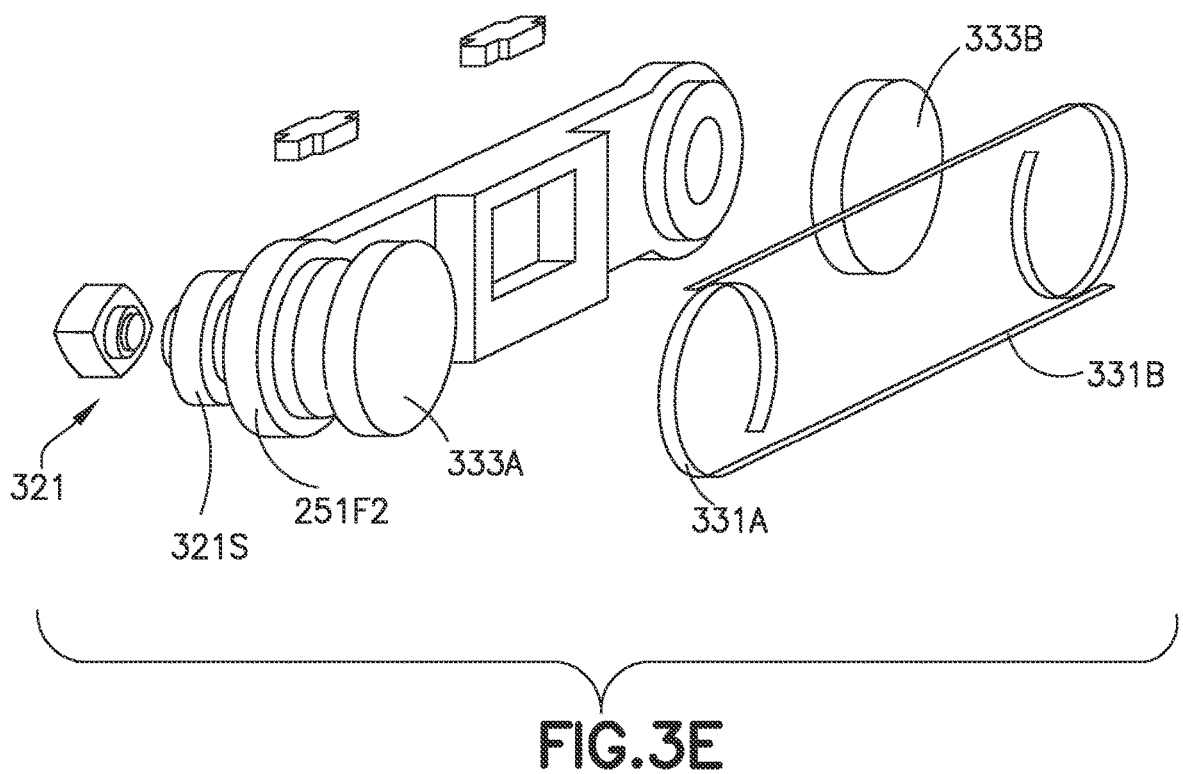
Figure 3G:
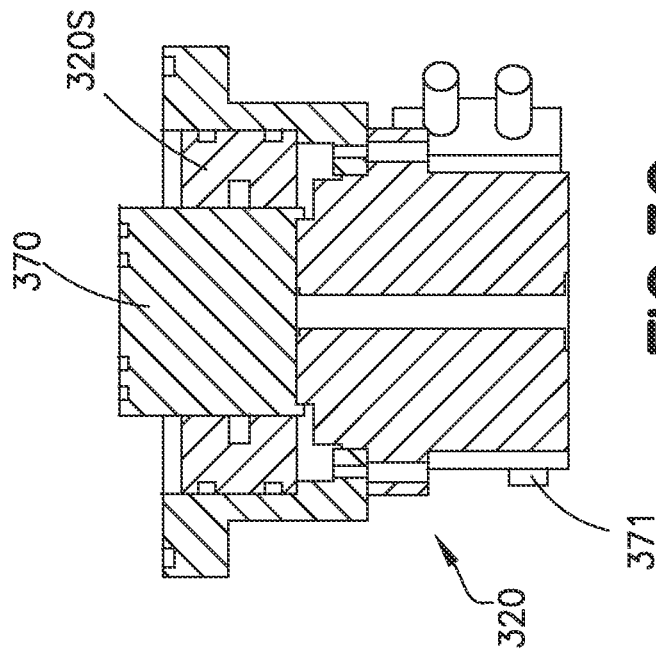
FIGS. 3F and 3G are schematic illustrations of a drive section in accordance with aspects of the disclosed embodiment.
Figure 3F:
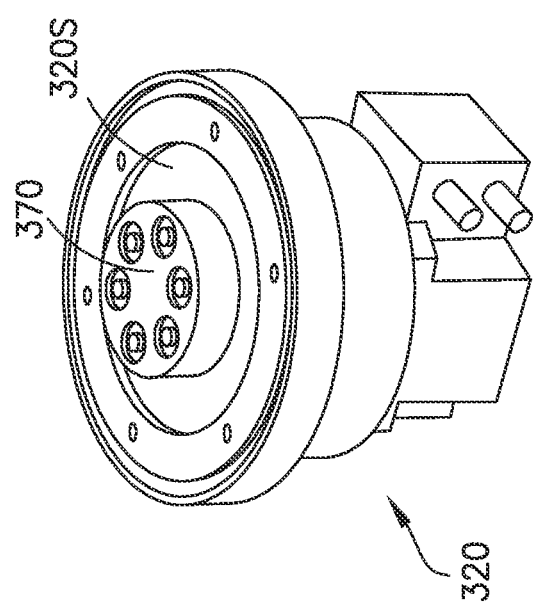
Figure 4A:
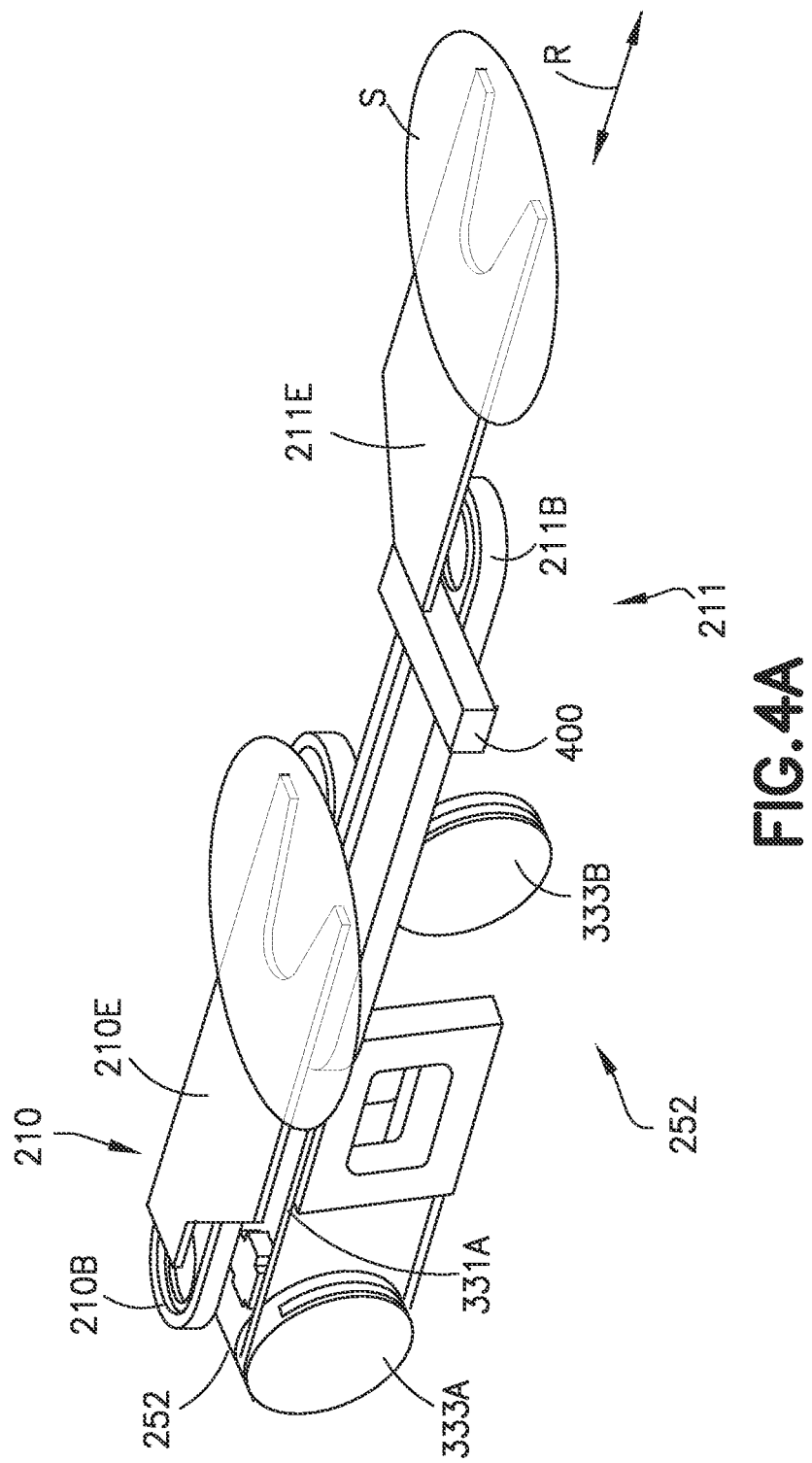
FIGS. 4A-4B are schematic illustrations of a portion of the substrate transport apparatus illustrated in FIGS. 2A-2D in accordance with aspects of the disclosed embodiment.
Figure 4B:
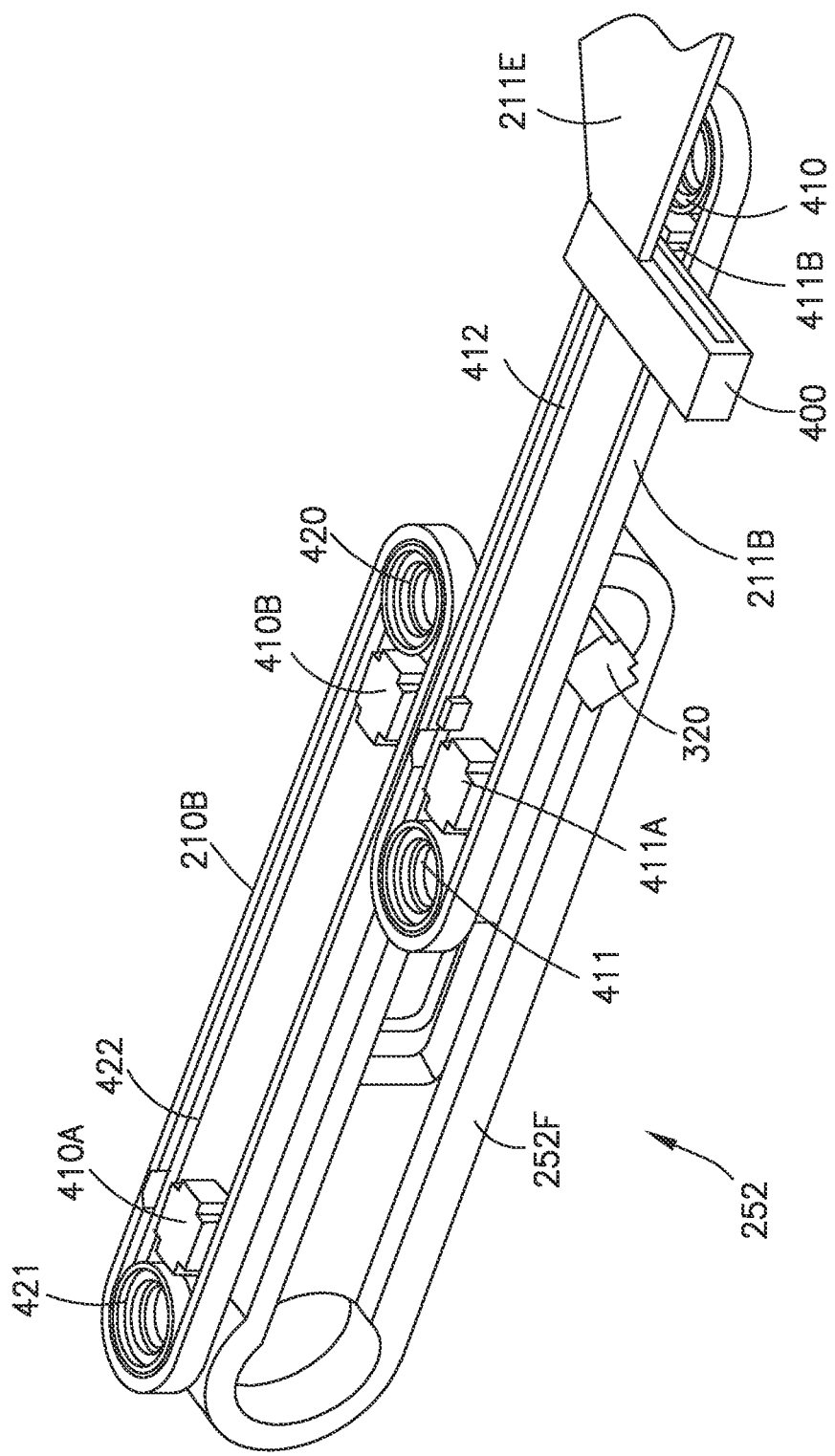
Figure 6:
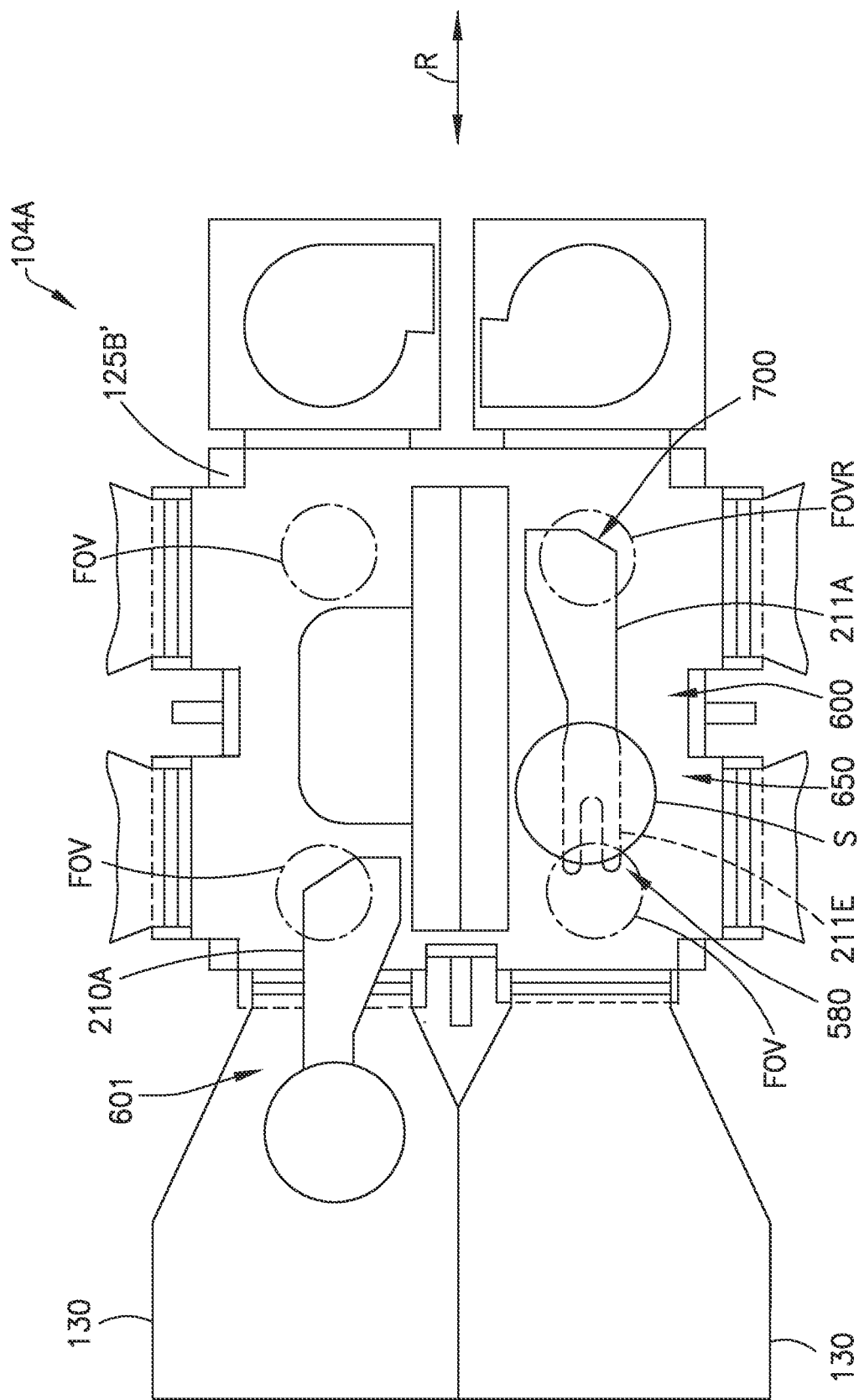
FIG. 6 is a schematic illustration of a portion of the substrate transport apparatus illustrated in FIGS. 2A-2D in accordance with aspects of the disclosed embodiment.
Figure 7:
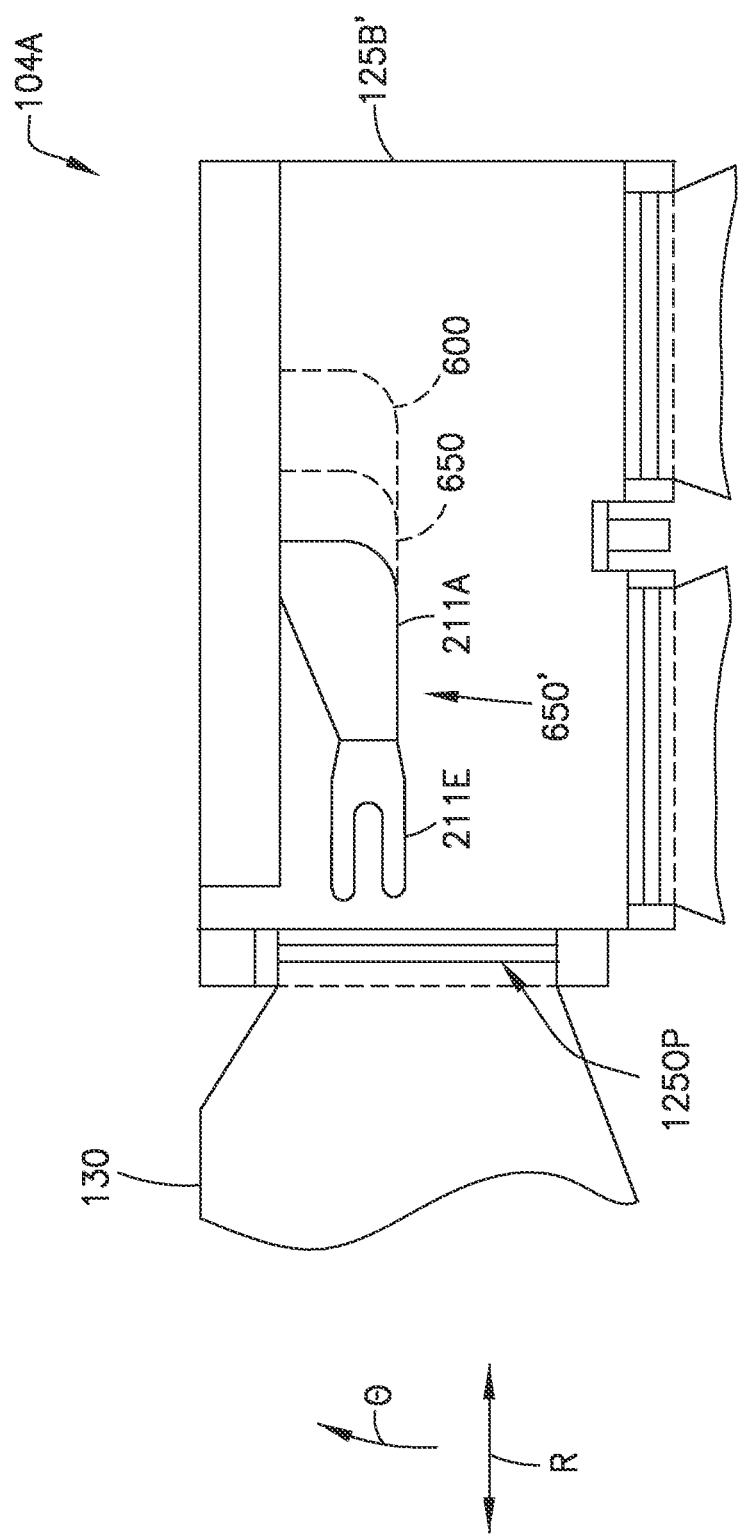
FIG. 7 is a schematic illustration of a portion of the substrate transport apparatus illustrated in FIGS. 2A-2D in accordance with aspects of the disclosed embodiment.

Referring to FIGS. 5-7, as may be realized, the substrate transport robot 104A is connected to and communicates with the controller 110 so that the controller 110 may control the movements of the at least one robot arm 210A, 211A. The controller is configured to command positional movement of the substrate transport robot 104A drive axes so that the end effector 210E, 211E is moved to any desired position in the processing apparatus 100A, 100B, 100C, 100D (that is within reach of the substrate transport apparatus 510) in a known and controlled manner. For example the at least one robot arm 210A, 211A may be coupled to the drive section 200' which may be any suitable drive section such as those described previously, and may include any desired position determining devices (e.g. such as the position or motor encoders 296, 371; FIGS. 2E and 3G) that are connected to the controller module 110M of the controller 110. The encoders 296, 371 send any suitable signals to the controller module 110M enabling the controller module 110M to determine a position of a predetermined point (such as the end effector center or any other suitable location) on the at least one robot arm 210A, 211A relative to the transport chamber 125B' (e.g., such as when the at least one robot arm 210A, 211A is in a retracted position 600).

In one aspect, the controller 110 may be programmed with a predetermined repeatable position 650, 650' of the at least one robot arm 210A, 211A along one or more of the R, θ, Z axes, configured to effect motion compensation without real time input of the drive axis encoder data to facilitate a decoupling of determination of the motion compensation from the encoder data. In one aspect, the controller 110 is configured to determine when the at least one robot arm 210A, 211A is in the predetermined repeatable position 650, 650' based on a known relation to a drive axis datum position. In one aspect, each motor 320', 321' 244' (see also motors 320, 321 in FIGS. 3D and 3E) and 280, 244 in FIGS. 2E and 2K) in the drive section 200' (e.g., for driving R and θ motion) or drive axis has a set datum position (which may be referred to as the 0° position) that provides a reference between the motor rotor and the motor stator. The datum position of the motor 320', 321', 244' is factory set and is substantially constant other than changes $\Delta_{RV}$ (FIG. 12)

(over time) from motor hysteresis (the $\Delta_{RV}$ may be resolved, if desired, from a resolver (such as, e.g., the camera 501R as further described below)).

The at least one robot arm 210A, 211A is connected to the drive section 200' (more specifically to the rotor(s) of the respective drive axis) and has (i.e., each arm link/joint has) a corresponding predetermined repeatable position 650 (relative to a global reference frame—e.g., the transport chamber frame 125F') established by the datum position. For example, the datum position may be the at least one robot arm 210A, 211A in the (fully) retracted position 600 (FIG. 6). The retracted position 600 may be known as the top center position in which arm motion is no longer capable of further retracting (i.e., arm motion is constricted by arm geometry and/or relation of robot arm 210A, 211A and any further arm motion therefrom may be extension of the robot arm 210A, 211A).

In another aspect, the predetermined repeatable position 650' (FIG. 7) may be selected (or otherwise unconstrained by mechanical geometry) based on an optimal (e.g., time) or desired motion profile of the at least one robot arm 210A, 211A for transporting the substrate S to any suitable module, such as substrate station module 130. Here, the at least one robot arm 210A, 211A is configured so that the at least one robot arm 210A, 211A retracts no further than a predetermined selectable point 650 extended beyond the (fully) retracted position 600 with respect to transport chamber 125B' and any further arm motion from the predetermined selectable point 650 may be extension of the robot arm 210A, 211A (i.e., the predetermined repeatable retracted position 650 may be offset along R, θ from mechanical constraint of the retracted position).

Each predetermined repeatable position 650, 650' (there may be more than one repeatable retracted position) may be taught to the controller 110 along the arm axis of motion R, θ in any suitable manner and has a known predetermined relation to the datum position 600. With respect to substrate placement correction/compensation, both predetermined repeatable positions 650, 650' are substantially similar with respect to how they are applied by the controller 110 in motion profile extension. In both aspects, the controller 110 receives a signal that the at least one robot arm 210A, 211A is in the predetermined repeatable position 650, 650' (either coincident with, or with a known predetermined rotation, from the datum position). Accordingly, the arm retraction position (such as positions 650, 650') is used herein both for convenience, and a signal of position received by the controller 110 communicating with the robot arm 210A, 211A at the predetermined repeatable position 650, 650' is sufficient for position determination of the robot arm 210A, 211A and for compensation of the arm position without real time input of drive axis encoder data, which may facilitate a decoupling of the determination of position compensation from encoder data based on known repeatable position signal. In other aspects, drive axis encoder data may be used for position determination of the robot arm 210A, 211A and positional compensation of the arm 210A, 211A.

Referring now to FIGS. 5, 6, and 8-13, as may be realized and noted above, dimensional characteristics of the at least one robot arm 210A, 211A may vary with environmental conditions, especially temperature. For example, the at least one robot arm 210A, 211A may undergo thermal expansion and contraction (among other thermal effects and/or other variabilities as noted above) as it is subjected to temperature variations during processing. These temperature variations effect the positioning of the at least one robot arm 210A, 211A, such that a centered position (e.g. a predetermined substrate hold position of the end effector such as reference point 1000WC) of the end effector 210E, 211E, or any other suitable portion on the end effector 210E, 211E, such as point 1010 on the tip of the end effector 210E, 211E (see FIGS. 10 and 11)) is offset or has a positional variance $\Delta_{PV}$ as further described below. In order to correct for positional variances $\Delta_{PV}$, the substrate transport apparatus 510 further includes the imaging system 500.

The imaging system 500 includes at least one camera 501F, 501R (generally referred to as camera 501) mounted in a predetermined location with respect to the transport chamber 125B' and disposed so as to image at least part 580 of the robot arm 210A, 211A. The camera 501 is configured to image one or more feature(s) of the at least one robot arm 210A, 211A, such as the end effector 210E, 211E or any other part of the arm 210A, 211A. The camera 501, which may be internal to or external from the transport chamber 125B', is mounted so that a field of view FOV of the camera 501 is positioned to capture the desired feature(s) of the at least one robot arm 210A, 211A. For example, the field of view FOV may be positioned to capture the end effector 210E, 211E with the substrate S thereon for determination of a substrate eccentricity $\Delta_{WC}$ with respect to the predetermined substrate hold position of the end effector 210E, 211E. In other aspects, the at least one camera 501 may be positioned so as to image any suitable portion of the distal end 210DE, 211DE (e.g., the end effector 210E, 211E or some feature thereon, the wrist joint, or features thereof joining the end effector 210E, 211E and arm link at the distal end 210DE, 211DE of the robot arm 210A, 211A) of the robot arm 210A, 211A, or any other suitable feature, such as the rear 210R, 211R of the robot arm 210A, 211A.

Figure 8:
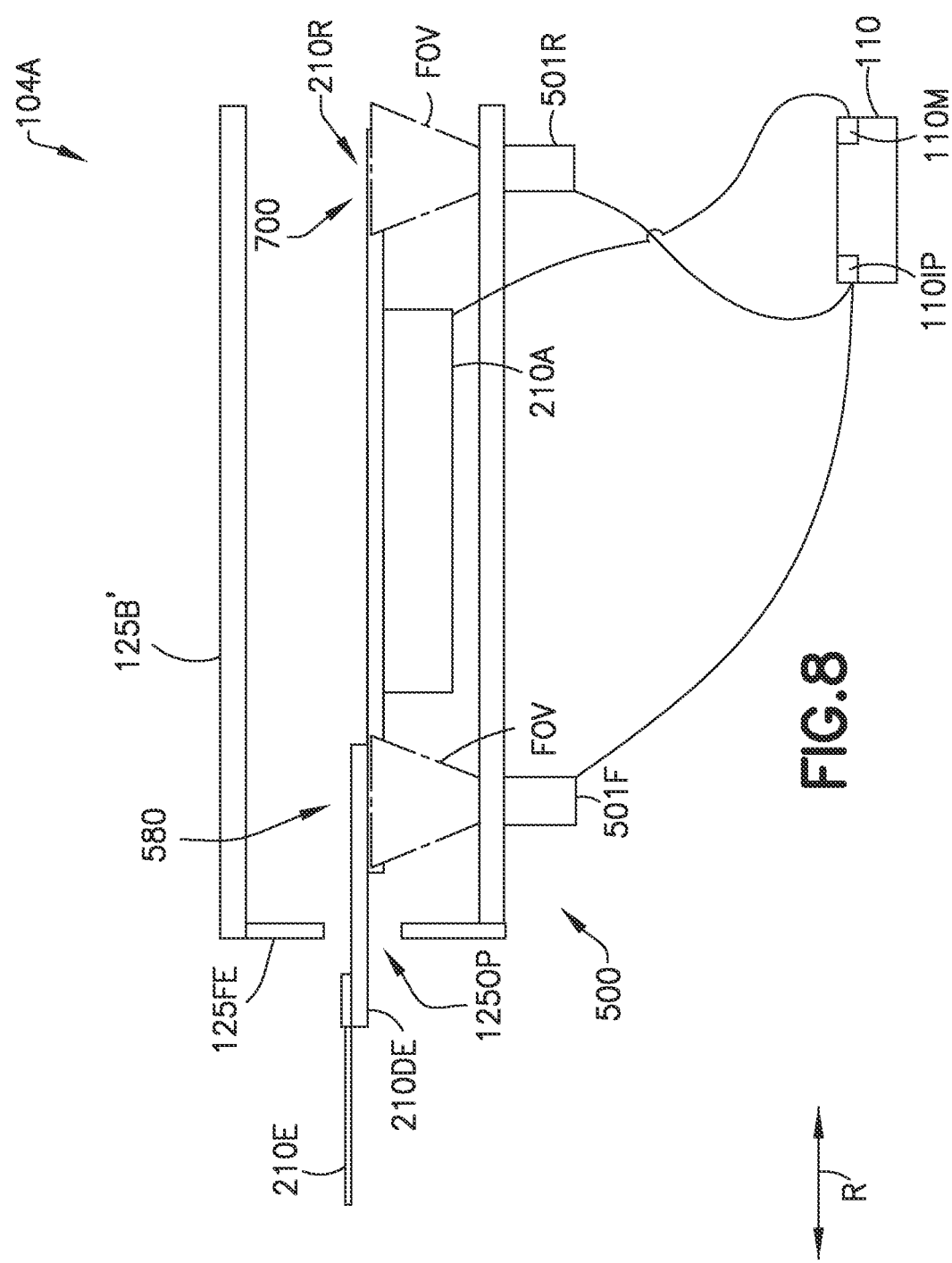
FIG. 8 is a schematic illustration of a portion of the substrate transport apparatus illustrated in FIGS. 2A-2D in accordance with aspects of the disclosed embodiment.
Figure 9:
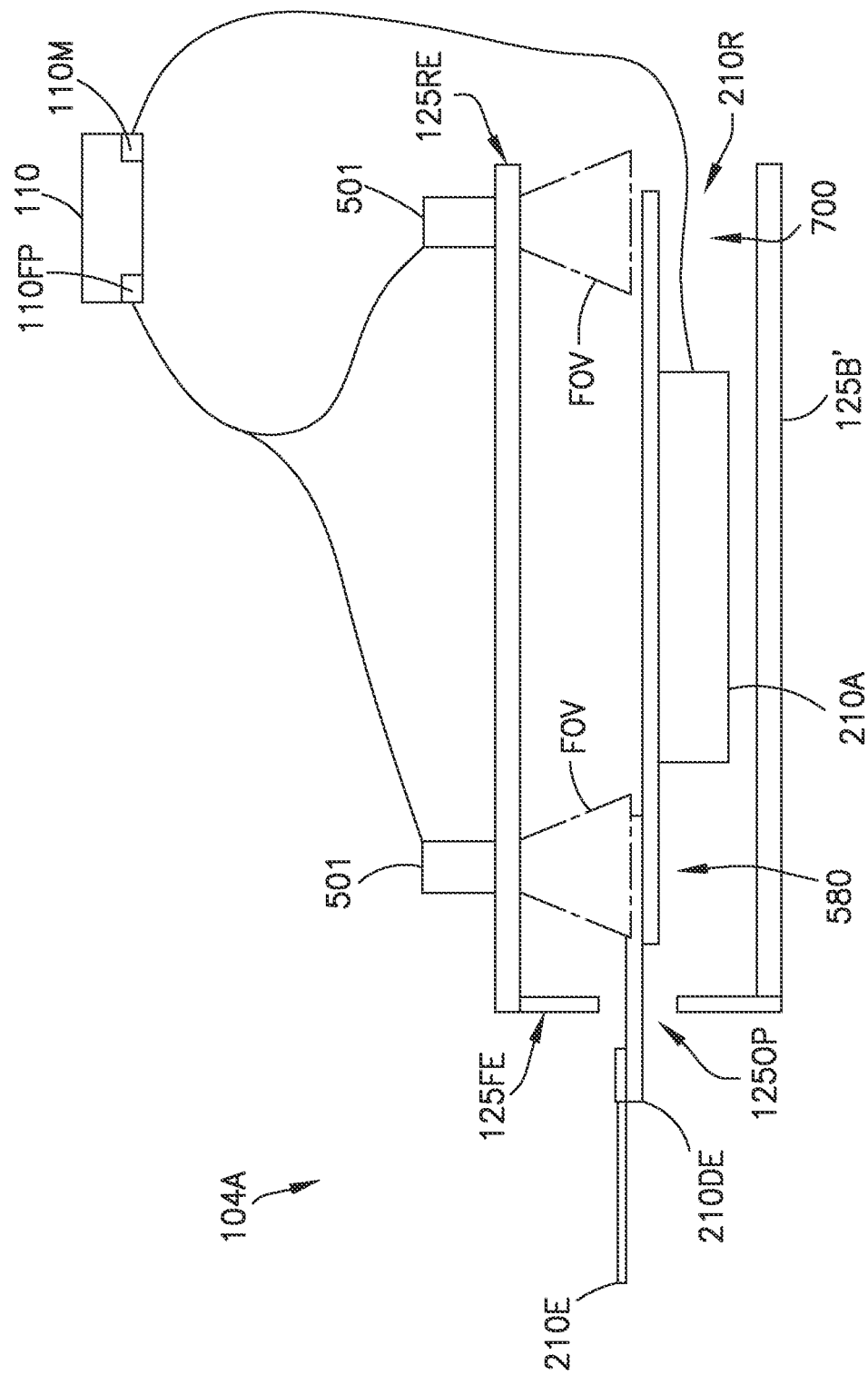
FIG. 9 is a schematic illustration of a portion of the substrate transport apparatus illustrated in FIGS. 2A-2D in accordance with aspects of the disclosed embodiment.
Figure 10:
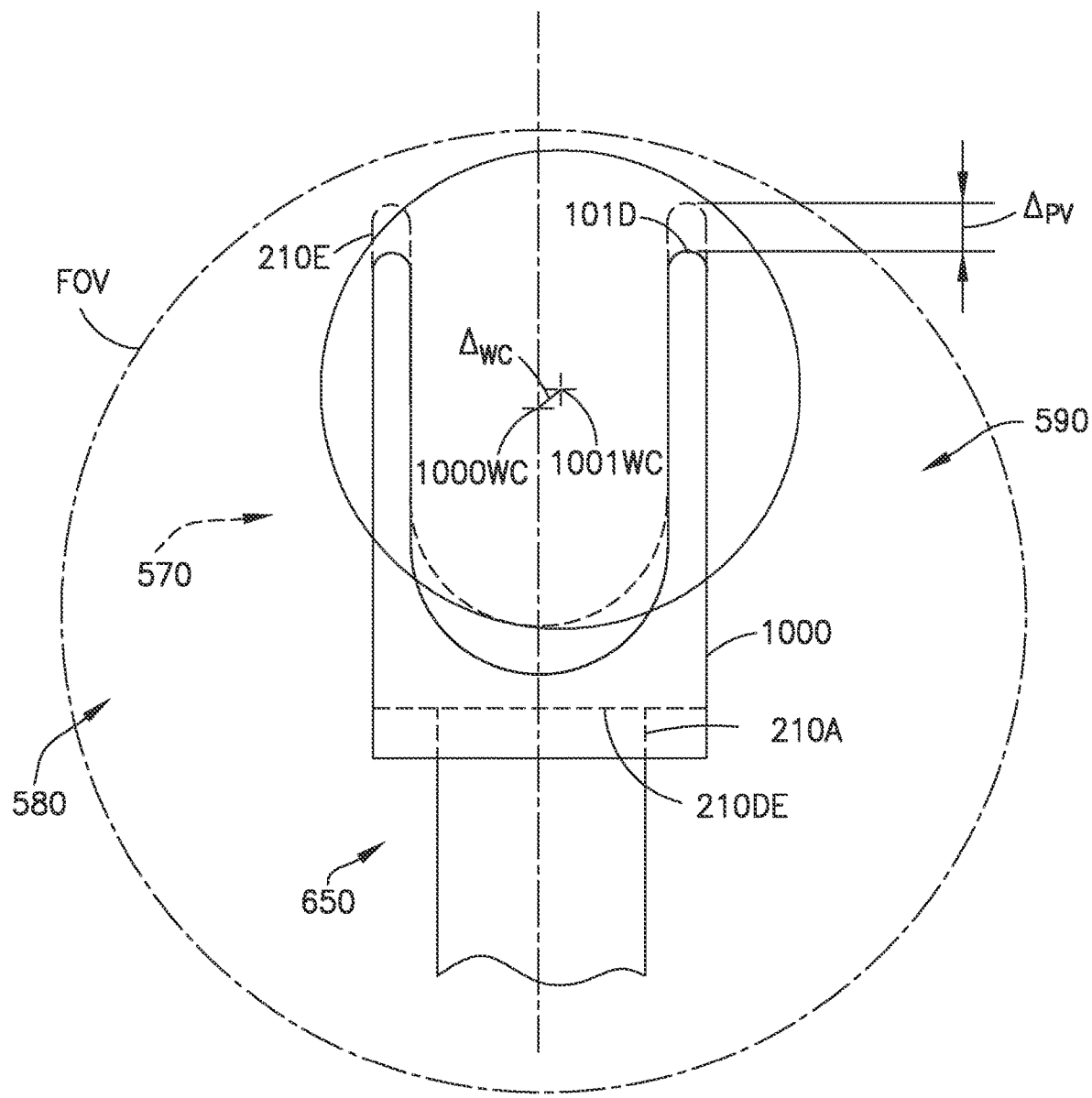
FIG. 10 is a schematic illustration of a portion of the substrate transport apparatus illustrated in FIGS. 2A-2D in accordance with aspects of the disclosed embodiment.
Figure 11:
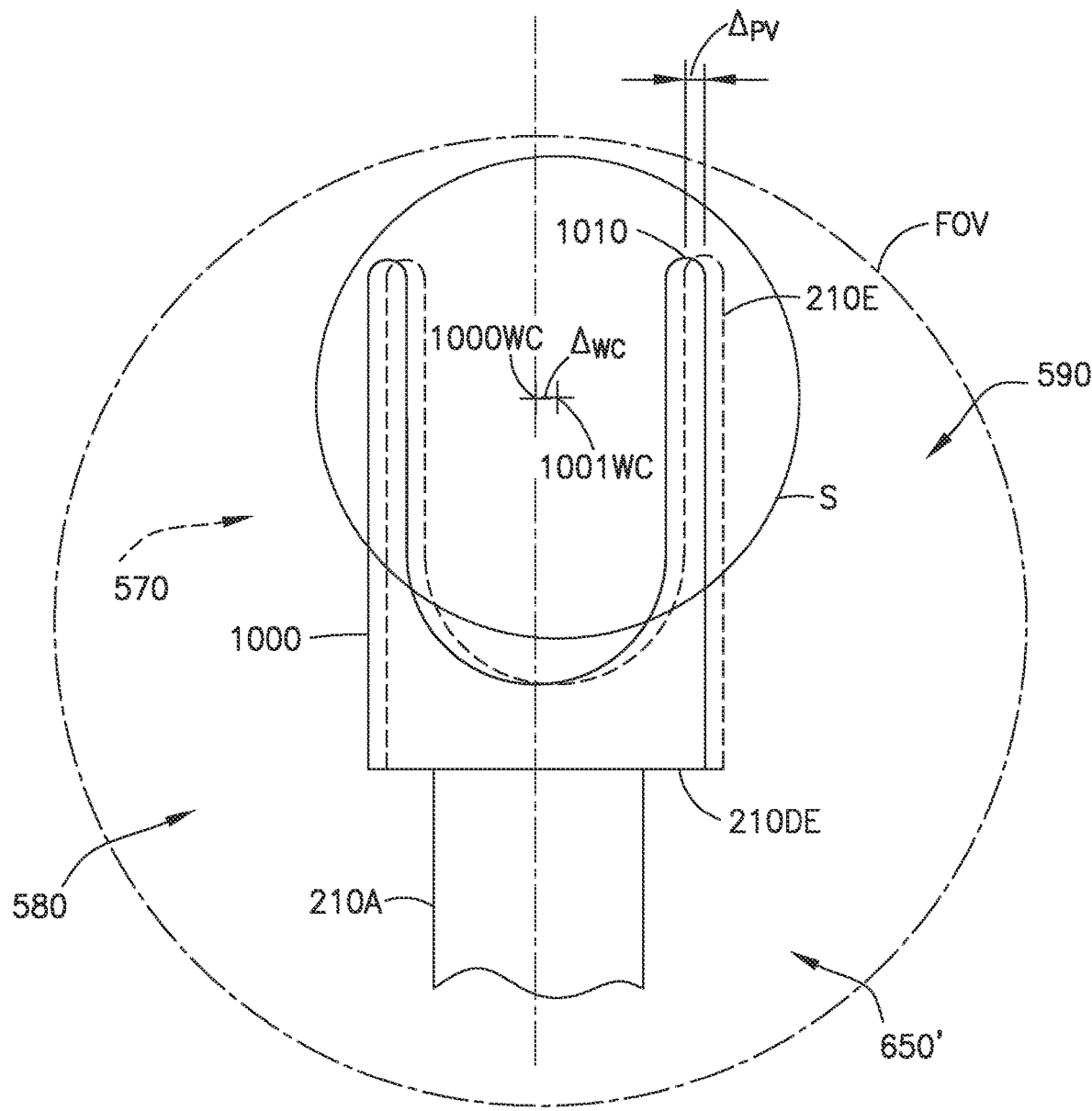
FIG. 11 is a schematic illustration of a portion of the substrate transport apparatus illustrated in FIGS. 2A-2D in accordance with aspects of the disclosed embodiment.

The camera 501 may be mounted to the transport apparatus 510 in any suitable manner, such as by mechanical fasteners. The position of the camera 501 relative to the transport apparatus 510 and system/components in the embodiment shown in FIGS. 8 and 9 are merely exemplary, and in alternate embodiments the camera 501 may be mounted in any other suitable location on the transport apparatus 510. For example, the camera 501 may be mounted toward the front 125FE (as referenced by the arm end effector direction of motion in extension) of the transport chamber 125B' (e.g., the front camera 501F) or the rear 125RE of the transport chamber 125B' (e.g., the rear camera 501R) to capture the desired part 580 of the robot arm 210A, 211A as the robot arm 210A, 211A is extended/retracted or disposed in the predetermined repeatable position 650, 650'. It is noted that the terms front and rear are used herein for convenience and any suitable spatial reference terms may be used; further noting that the front and the rear of the transport chamber 125B' correspond with an extension direction of the robot arm 210A, 211A into the process chamber 130 such that the front and rear directions may change depending on a θ orientation of the substrate transport robot 104A relative to the transport chamber 125B'. Additionally, camera 501 is schematically illustrated in FIGS. 8 and 9 as two cameras 501F (front), 501R (rear), however camera 501 may comprise more or less than two cameras (such as four cameras (FIG. 6)) distributed at different locations on/in the transport chamber 125B' so as to image the at least one robot arm 210A, 211A when positioned for picking and placing substrates S through any of the sides (in this example, 4 sides 125S1-S4 are illustrated but in other aspects the transport chamber 125B' may have more or less than 4 sides) of the transport chamber 125B'.

The camera 501 comprises any suitable optics for generating a suitable image from the field of view FOV of the camera 501. The camera optics may include for example, any suitable lenses, filters, mirrors, aperture (not shown) for guiding and controlling the amount of light directed to the camera 501. The field of view FOV is arranged for the camera 501 to image a space (i.e., image coverage) that may encompass substantially the entire robot arm 210A, 211A and substrate S or any desired part thereof. For example, the camera 501 may be positioned to capture part 580 of the at least one robot arm 210A, 211A proximate to the joint coupling the robot arm 210A, 211A to the drive section (i.e., a shoulder axis). In one aspect, the camera 501 may be gimbaled by suitable servomotors to rotate the field of view FOV to provide any desired image coverage of the robot arm 210A, 211A.

Referring to FIGS. 8-13, the camera 501 is coupled to an image processing module 110IP of the controller 110. The image processing module 110IP of the controller 110 may include any suitable non-transitory program code for operating the camera 501 to capture images as desired. For example, the image processing module 110IP may send a generate image command to the camera 501 and instruct the camera 501 as to which images are to be transmitted to the controller 110. The image processing module 110IP is configured to receive the images from the camera 501, and identify a positional variance $\Delta_{PV}$ of at least part 580 of the robot arm 210A, 211A from the images. In order to identify the positional variance $\Delta_{PV}$, the image processing module 110IP includes the calibration image 590 (or other data stored in the controller 110 so as to describe dispositive features of the calibration real or virtual/design image) of the robot arm 210A, 211A in the predetermined repeatable position 650, 650', 600 or any other suitable position of the robot arm 210A, 211A. The calibration image 590 may be generated in a number of ways. For example, the calibration image 590 may be generated from design information that renders a virtual representation of at least the part 580 of the robot arm 210A, 211A disposed by design in the camera 501 field of view FOV. In another aspect, the calibration image 590 may be generated by the image processing module 110IP of the controller 110 effecting capture of the calibration image 590, with the camera 501, of the at least part 580 of the arm with the arm proximate the predetermined repeatable position 650, 650', 600 or in the predetermined repeatable position 650, 650', 600 or any other suitable position.

As seen in FIGS. 10-13 and 17, there is shown a graphical representation of an exemplary first image 570 of the part 580 of the robot arm 210A (with the arm proximate the predetermined repeatable position 650, 650', 600 or in the predetermined repeatable position 650, 650', 600 or any other suitable position) in the field of view FOV of the camera 501 overlaid on the calibration image 590 (the calibration image is shown in solid lines while the first image of the part 580 of the robot arm 210A is shown in dashed lines). For example, the calibration image 590 includes an end effector 1000 in the predetermined repeatable position 650, 600 before placement into the substrate station modules 130. As may be realized and shown in FIG. 7, a predetermined repeatable position (or more than one) 650' may be located further offset in the direction of extension (R, θ) from the predetermined repeatable retracted position 650, 600 so as to provide a series, or at least a pair (650, 600) of predetermined repeatable positions (650', 600). As may be realized, the first image 570 may be generated with the arm a position 600/650. A second image from the series is generated with the arm at position 650'/650 and so on. The first, second, and each other image in the series generated with the arm in a different predetermined repeatable position is compared to, a corresponding calibrated image with the arm in the predetermined position. During operation of the at least one robot arm 210A, 211A in the transport chamber 125B', and as the processing temperature of the substrate processing equipment changes, radial transitions of the robot arm 210A, 211A may drift (e.g., the position of the imaged end effector and thus point 1010 as well as the center point. 1000WC that has a fixed relation to point 1010 will vary from the position in calibration and as defined in the calibration image registered the controller 110). As such it is possible to measure the resultant thermal effects and/or the other variabilities by comparing the position data of the calibration image 590 to their relative values in at least the first image 570 for the series of predetermined repeatable positions 650, 650', 600. Thus, as may be realized, though the distal end features of the arm vary dimensionally, the predetermined repeatable positions 650', 650, 600 are substantially constant and are registered by the controller 110 as such. (other than motor hysteresis resolved as further described) so that the dimensional variance may be determined from leveraging the predetermined repeatable position signal independent of incremental encoder data.

Figure 17:
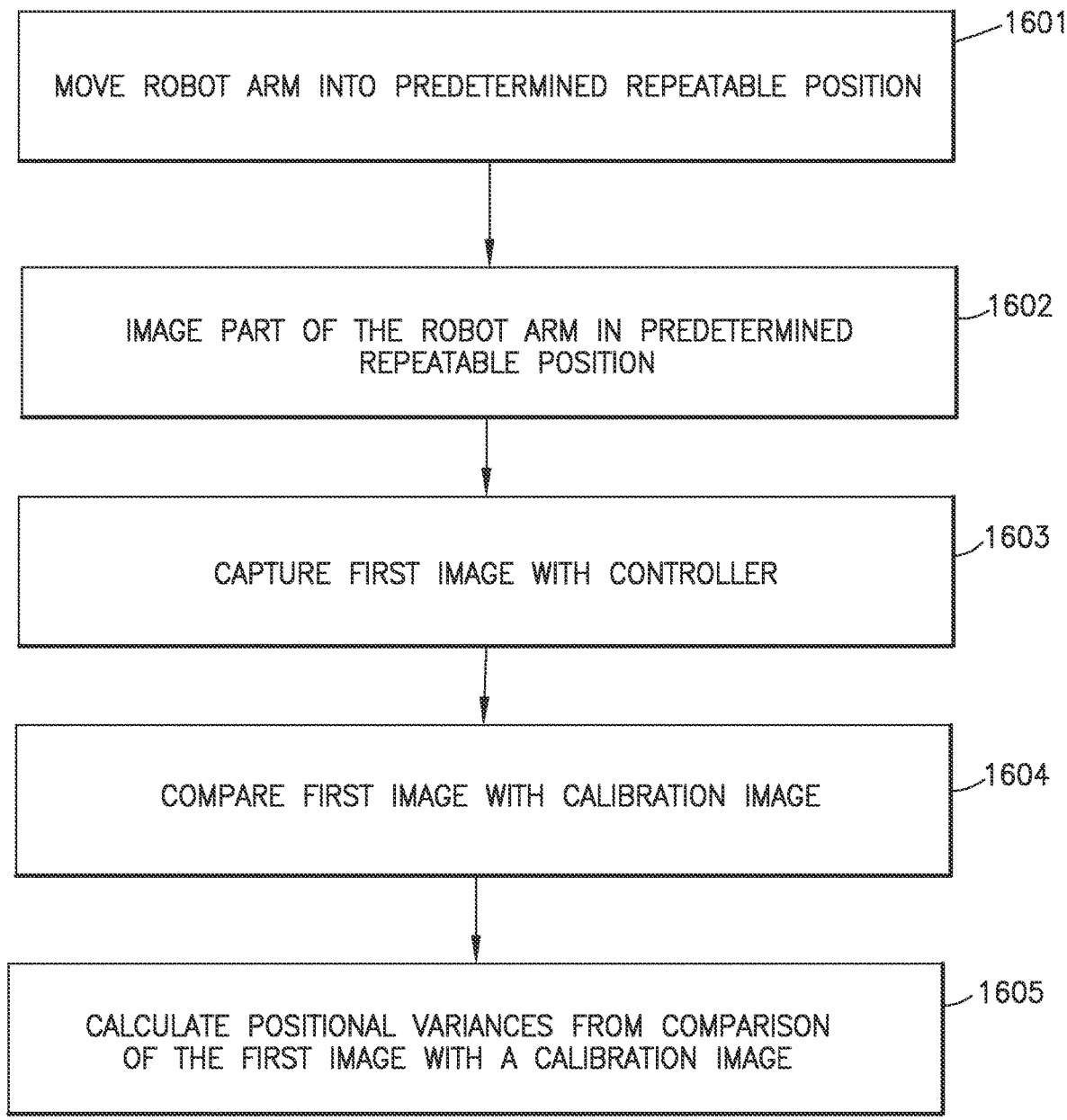
FIG. 17 is a flow chart of a method of operation of a substrate transport apparatus in accordance with one or more aspects of the disclosed embodiment.

The first image 570 may depict the reference point (such as point 1010) of the end effector 210E after being placed into the transport chamber 125B' (i.e., retracted or during retraction to the predetermined repeatable position 650, 600). The thermal effects and/or other variabilities can be calculated by comparing the position variance $\Delta_{PV}$ between at least the first image 570 and the calibration image 590 (positional variances $\Delta_{PV}$ may be performed by suitable algorithms, resident in controller 110, to identify for example, expansion, contraction, twisting, or drooping/sagging of the at least one robot arm 210A, 211A; suitable algorithms may be found in, e.g., U.S. application Ser. No. 15/209,497, titled "ON THE FLY AUTOMATIC WAFER CENTERING METHOD AND APPARATUS" filed Jul. 13, 2016, the disclosure of which is incorporated herein by reference in its entirety). For example, in one aspect, the at least one robot arm. 210A, 211A picks a substrate S from any suitable substrate holding location with the end effector 210E, 211E. The at least one robot arm 210A, 211A moves into the predetermined repeatable position 650, 650', 600, for example, in a (fully) retracted position. 600 (FIG. 17, Block 1601). While in the predetermined repeatable position. 650, 650', the camera 501 images and the controller 110 captures at least the first image 570 of the part 580 of the at least one robot arm 210A, 211A (FIG. 17, Blocks 1602 and 1603). The first image 570 is compared to the calibration image 590 (FIG. 17, Block 1604). The position variance $\Delta_{PV}$ is determined based on comparison of the two images (FIG. 17, Block 1605). As the at least one robot arm 210A, 211A moves towards the substrate station module 130 (e.g. to place the substrate S), the controller 110 performs motion compensation based on the determined positional variance $\Delta_{PV}$. In other aspects, the controller 110 may be configured to determine a center 1001WC of the imaged substrate S in at least the first image 570 (i.e., a common image operation with the image identifying positional variance angles) or with a supplement first image taken with the substrate on the end effector and the arm in the predetermined repeatable position 650, 650' and determine a position variance $\Delta_{WC}$ from comparison of the determined center 1001WC of the imaged substrate with a predetermined substrate hold position 1000WC in the calibration image 590 and adjust a place position of the substrate accordingly. It is further noted that any suitable number of images may be taken of any suitable part of the robot arms 210A, 211A and the substrate S and any suitable number of calibration images may be used to compare the position variances, such as one calibration image for end effector positional variances and one calibration image for substrate centering.

Referring again to FIG. 6, in one aspect, the controller 110 may be configured to image, with the imaging system 500, at least a different feature on the same arm or a different part 601 (such as the wrist of the robot arm 210A, 211A) of the at least one robot arm 210A, 211A (with a predetermined position relative to the at least part 580 of the at least one robot arm 210A, 211A). For example, as noted above, the front camera 501F may be configured to capture at least a second image of, e.g., the joint coupling the end effector to the robot arm 210A, 211A. As may be realized, the controller 110 effects capture of the second image of the different part 601 of the at least one robot arm 210A, 211A, moving to or in a different predetermined repeatable radial position such as the position 650' or other position along the axis of motion (R, θ) similar to position 650', and if desired, with the end effector located within, wholly or at least in part in the process module 130, and may be utilized to calculate another positional variance $\Delta_{RV}$ (FIG. 12) of the at least one robot arm 210A, 211A.

In a further aspect, referring now to FIG. 12, the controller 110 may be configured to image, with the imaging system 500, at least different part 700 (such as the rear of the robot arm 210A, 211A) of the at least one robot arm 210A, 211A (with a predetermined position relative to the at least part 580 of the at least one robot arm 210A, 211A). For example, as noted above, a resolver (i.e., the rear camera 501R) may be configured to capture at least a second image 710 of, e.g., the of the joint coupling the robot arm 210A, 211A to the drive section 200' or rear 210R, 211R of the robot arm 210A, 211A (see, e.g., FIGS. 6, 8 and 9). As may be realized, the controller 110 effects capture of the second image 710 of the different part 700 of the at least one robot arm 210A, 211A, moving to or in a different predetermined radial position, and may be utilized to calculate another positional variance $\Delta_{RV}$ (FIG. 12) of the at least one robot arm 210A, 211A.

As noted above the position of robot arm 210A, 211A may be affected by drive axis hysteresis and uncommanded mechanical variances (related to joint and transmission wear, deformations/reflections, etc.). These variances may be resolved with, e.g., the rear camera 501R (also referred to as a resolver). The rear camera 501R may be positioned such that the field of view FOVR captures images of the different part 700 of the robot arm 210A, 211A proximate to the location of the joint coupling the robot arm 210A, 211A (or any desired arm link/joint) to the drive section 200' or drive axis (i.e., the rear camera 501R is positioned to image the rear 210R, 211R of the robot arm 210A, 211A (link) substantially opposite the end effector 210E, 211E, but the camera 201 may be positioned as desired. For example, in another aspect, the transport chamber 125B' may be a compact transport chamber (with respect to the robot arm 210A, 211A footprint—minimum clearance) and the resolver may be the camera position proximate substantially to the transport opening 1250P. The camera 501R images the rear 210R, 211R of the robot arm 210A, 211A (which may have reference indicia placed thereon as further described below, or may be a structural edge such as of the robot arm 210A in the image) proximate to or at the predetermined repeatable position 650, 650'. At least the second image 710 is compared to a different calibration image 720 (or data including positional information on of a calibrated robot arm 750) to identify the positional variance $\Delta_{RV}$ from the position of the robot arm 210A, 211A in the second image 710 compared to the calibration image 720. In one aspect, the controller 110 may be configured to combine the positional variance $\Delta_{RV}$ determined from the second image 710 with position variance data $\Delta_{PV}$ determined from at least the first image 570 (i.e., from the end of the robot arm 210A, 211A with the end effector 210E, 211E) and teach/update the repeatable retracted and extension position to the arm motion controller module 110M (in other words the data is used to "zero" out the repeatable retract/extension position). In another aspect, $\Delta_{PV}$ and $\Delta_{RV}$ may be combined for position compensation for picking and placing substrates.

Referring now to FIG. 13, in one aspect, the first image 570 may include an arm feature 1100 with a predetermined substantially steady state dimension relative to a predetermined substrate hold position (such as 1000WC) of the end effector 210E, 211E. Generally, the substantially steady state dimension has a dimension component aligned with the radial direction R and another dimension component in a direction N angled at a non-zero crossing angle α with the radial direction R.

The positional variance calculated by the controller 110 from a comparison of the first image 570 and calibration image 590 of the at least part 580 of the at least one robot arm 210A, 211A include a positional variance component in the radial direction R and another variance component in a direction N angled at the non-zero crossing angle φ with the radial direction R, and the motion compensation factor changes the extended position of the arm in at least one of the radial direction and in the angled direction.

Referring now to FIG. 14, in one aspect, the at least part 580 of the at least one robot arm 210A, 211A captured in the first image 570, includes an indicia pattern 1200 such as a barcode. In one aspect, an incremental distribution of indicia 1200I of the indicia pattern 1200 is disposed on the at least part 580 of the at least one robot arm 210A, 211A. In this aspect, the controller 110 determines the position variance $\Delta_{PV}$, due to, e.g., thermal changes from comparison of the incremental distribution of indicia 1200I imaged in the first image 570 with a calibrated distribution of indicia 1202 in calibration image 1201. In one aspect, the indicia pattern 1200 has a planar distribution in the radial direction R and a direction M angled at a non-zero crossing angle γ to the radial direction R.

Referring now to FIG. 15, a graph is illustrated showing a wafer placement correction 1400 of wafer placement utilizing the aspects of the substrate transport apparatus described herein, compared to wafer initial offset 1401 using conventional methods. Here it can be seen that, motion compensation provided by the imaging system 500 (compared to the conventional methods without motion compensation) provides the substrate transport apparatus 510 with a placement correction of less than or equal to about ±4.5 mm to less than or equal to about ±0.025 mm. For example, the aspects of the present disclosure may provide the substrate transport apparatus 510 better accuracy in wafer placement compared to a conventional substrate apparatus that does not have motion compensation.

Figure 16:
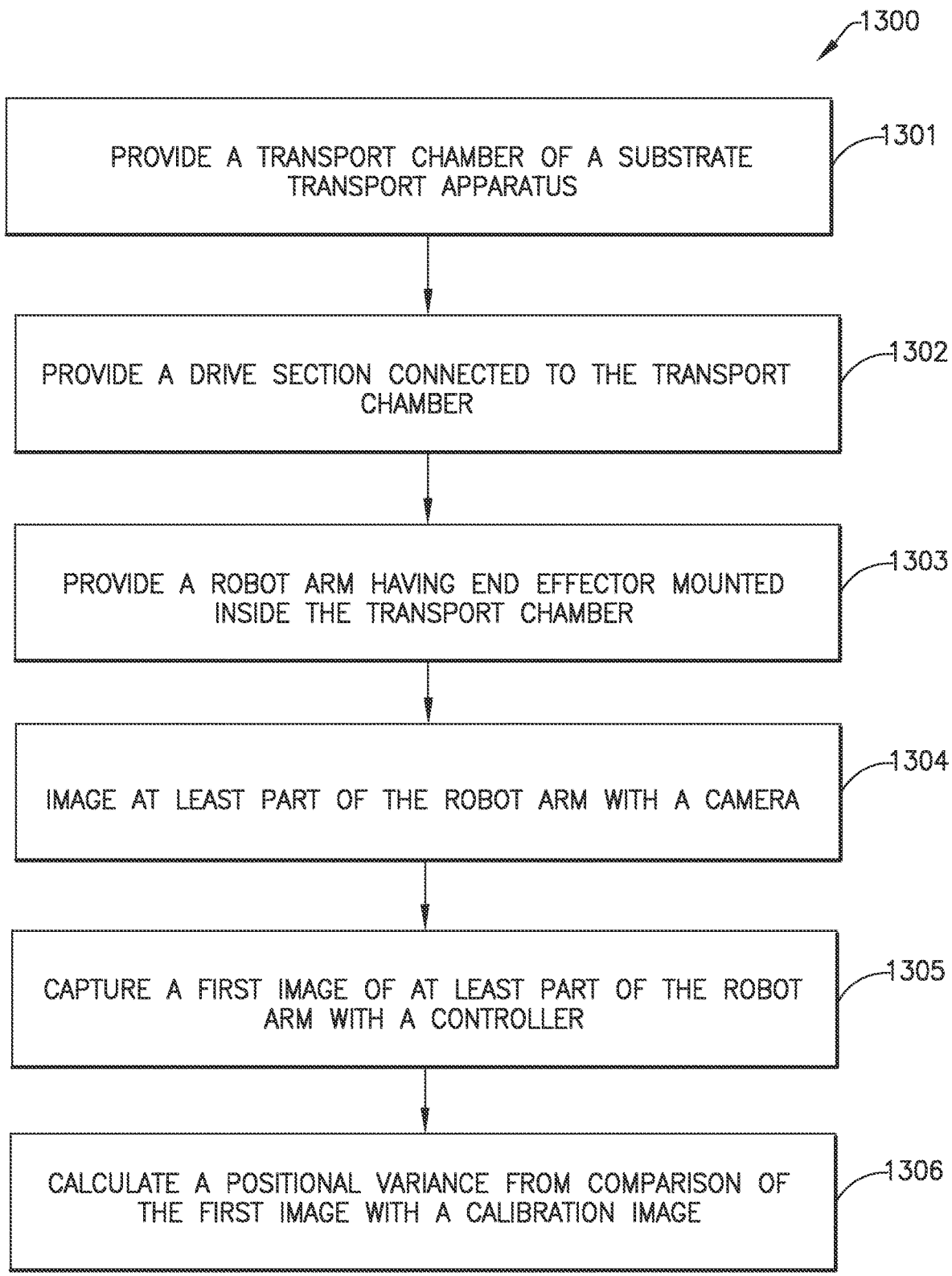
FIG. 16 is a flow chart of a method of operation of a substrate transport apparatus in accordance with one or more aspects of the disclosed embodiment.

Referring now to FIG. 16, an exemplary operation of the aspects of the disclosed embodiment will be described. In one aspect, the method 1300 includes providing a transport chamber 125B' of a substrate transport apparatus 510 (FIG. 16, Block 1301). The transport chamber 125B' having a substrate transport opening 1250P in communication with a substrate station module 130. The method further includes providing a drive section 200' connected to the transport chamber 125B' (FIG. 16, Block 1302), the drive section 200' having a motor 125M defining at least one independent drive axis. The method 1300 further includes providing a robot arm 210A, 211A having end effector 210E, 211E mounted inside the transport chamber 125B' (FIG. 16, Block 1303). The robot arm 210A, 211A is operably connected to the drive section 200' generating, with the at least one independent drive axis, at least arm motion in a radial direction R extending and retracting the robot arm 210A, 211A and moving the end effector 210E, 211E, in the radial direction R, from a retracted position to an extended position. While the robot arm 210A, 211A is in a predetermined repeatable position 650, 650' defined by the at least one independent drive axis, imaging system 500 images, with a camera, at least part of the robot arm 210A, 211A (FIG. 16, Block 1304). The imaging system 500 is mounted in a predetermined location with respect to the transport chamber 125B' and the robot arm 210A, 211A is imaged moving to or in the predetermined repeatable position 650, 650'. The controller 110 captures a first image 570 of at least part 580 of the robot arm 210A, 211A (FIG. 16, Block 1305) on registry of the robot arm 210A, 211A proximate to or in the predetermined repeatable position 650, 650' decoupled (i.e., independent) from encoder data of the at least one drive section 200'. With the first image 570, a positional variance $\Delta_{PV}$ is identified from comparison of the first image 570 with a calibration image 590 (FIG. 16, Block 1306) to determine a motion compensation factor changing the extended position of the robot arm 210A, 211A.

It is noted that although the aspects of the present embodiments are described with respect to the at least one robot arm 210A, 211A retracting or in a retracted position, the aspects of the present embodiments may also be used for extension of the robot arm 210A, 211A. For example, the robot arm 210A, 211A may have a repeatable extended position that is selected during calibration of the robot arm 210A, 211A. The repeatable extended position may be, e.g., at the substrate hold position in the processing module 130 which has a known predetermined rotation position (θ rotation of the axis drive) from the drive axis encoder datum. The controller receives a signal from the encoder when the encoder reaches the known predetermined rotation position to indicate that the robot arm 210A, 211A is in the repeatable extended position. Once in the repeatable extended position, motion compensation is determined substantially similar to that above with respect to the robot arm 210A, 211A in the retracted position (i.e., an image is captured and compared with a pre-programmed calibration image).

In accordance with one or more aspects of the disclosed embodiments a substrate transport apparatus is provided. The substrate transport apparatus including a transport chamber with a substrate transport opening arranged for communication with a substrate station module, a drive section connected to the transport chamber, and having a motor defining at least one independent drive axis, a robot arm mounted inside the transport chamber, and having an end effector at a distal end of the robot arm, configured to support a substrate thereon, the robot arm being operably connected to the drive section generating, with the at least one independent drive axis, at least arm motion in a radial direction extending and retracting the robot arm and moving the end effector, in the radial direction, from a retracted position to an extended position, an imaging system with a camera mounted in a predetermined location with respect to the transport chamber and disposed so as to image at least part of the robot arm, and a controller communicably connected to the imaging system and configured to image, with the camera, the at least part of the robot arm moving to or in a predetermined repeatable position defined by the at least one independent drive axis, the controller effecting capture of a first image of the at least part of the robot arm on registry of the robot arm proximate to or in the predetermined repeatable position decoupled (independent) from encoder data of the at least one drive axis, wherein the controller is configured to calculate a positional variance of the at least part of the robot arm from comparison of the first image with a calibration image of the at least part of the robot arm, and from the positional variance determine a motion compensation factor changing the extended position of the robot arm.

In accordance with one or more aspects of the disclosed embodiments the determined motion compensation factor calculated by the controller is independent of controller registry of the encoder data identifying position of the robot arm.

In accordance with one or more aspects of the disclosed embodiments the at least part of the robot arm captured in the first image includes a robot arm feature, imaged in the first image, with a predetermined substantially steady state dimension relative to a predetermined substrate hold position of the end effector.

In accordance with one or more aspects of the disclosed embodiments the substantially steady state dimension has a dimension component aligned with the radial direction and another dimension component in a direction angled at a non-zero crossing angle with the radial direction.

In accordance with one or more aspects of the disclosed embodiments the positional variance calculated by the controller from the comparison of the first image and calibration image of the at least part of the robot arm include a positional variance component in the radial direction and another variance component in a direction angled at a non-zero crossing angle with the radial direction, and the motion compensation factor changes the extended position of the robot arm in at least one of the radial direction and in the angled direction.

In accordance with one or more aspects of the disclosed embodiments the at least part of the robot arm captured in the first image includes the end effector with a substrate thereon, which end effector with substrate being imaged in the first image, and the controller determines a substrate eccentricity with respect to a predetermined substrate hold position of the end effector.

In accordance with one or more aspects of the disclosed embodiments the controller is programmed so as to determine a center of the imaged substrate in the first image and determine the position variance from comparison of the determined center of the imaged substrate with the predetermined substrate hold position in the calibration image of the at least part of the robot arm.

In accordance with one or more aspects of the disclosed embodiments the controller determines the position variance due to thermal changes of the robot arm from comparison of the robot arm feature imaged in the first image with a calibration image of the robot arm feature in the calibration image of the at least part of the robot arm.

In accordance with one or more aspects of the disclosed embodiments the at least part of the robot arm captured in the first image includes an indicia pattern with an incremental distribution of indicia on the at least part of the robot arm, and imaged in the first image, and the controller determines the position variance due to thermal changes of the robot arm from comparison of the incremental distribution of indicia imaged in the first image with a calibrated distribution of indicia.

In accordance with one or more aspects of the disclosed embodiments the indicia pattern has a planar distribution in the radial direction and a direction angled at a non-zero crossing angle to the radial direction.

In accordance with one or more aspects of the disclosed embodiments the calibration image (or data stored in the controller so as to describe dispositive features of the calibration image) is generated from design information rendering virtual representation of the least part of the robot arm disposed by design in the camera field of view.

In accordance with one or more aspects of the disclosed embodiments the calibration image is generated by the controller effecting capture of the calibration image, with the camera, of the at least part of the robot arm with the arm position proximate or in the predetermined repeatable position.

In accordance with one or more aspects of the disclosed embodiments the controller is configured to image, with the camera, the at least part of the robot arm and/or at least a different part of the robot arm (with a predetermined position relative to the at least part of the robot arm) moving to or in a different predetermined radial position defined by the at least one independent drive axis, the controller effecting capture of a second image of the at least part of the robot arm and/or at least the different part of the robot arm moving to or in the different predetermined radial position, and wherein the controller is configured to calculate another positional variance of the at least part of the robot arm from comparison of the second image with another calibration image of the at least part of the robot arm and/or at least the different part of the robot arm corresponding to the different predetermined radial position, and from the other positional variance determine a further motion compensation distance combined with the motion compensation distance so as to define a total motion compensation changing the extended position of the robot arm.

In accordance with one or more aspects of the disclosed embodiments the further motion compensation distance defines a correction factor to the motion compensation distance to determine the total motion compensation changing the extended position of the robot arm.

In accordance with one or more aspects of the disclosed embodiments a substrate transport apparatus is provided. The substrate transport apparatus including a transport chamber with a substrate transport opening arranged for communication with a substrate station module, a drive section connected to the transport chamber, and having a motor defining at least one independent drive axis, a robot arm mounted inside the transport chamber, and having an end effector at a distal end of the robot arm, configured to support a substrate thereon, the robot arm being operably connected to the drive section generating, with the at least one independent drive axis, at least arm motion in a radial direction extending and retracting the robot arm and moving the end effector, in the radial direction, from a retracted position to an extended position, an imaging system with a camera mounted in a predetermined location with respect to the transport chamber and disposed so as to image at least part of the robot arm, and a controller communicably connected to the imaging system and configured to image, with the camera, the at least part of the robot arm retracting to or in a predetermined repeatable retracted position defined by the at least one independent drive axis, the controller effecting capture of a first image of the at least part of the robot arm on registry of the robot arm retraction proximate to or in the predetermined repeatable retracted position, wherein the controller is configured to identify a positional variance of the at least part of the robot arm from comparison of the first image with a calibration image of the at least part of the robot arm, and from the positional variance determine a motion compensation distance changing the extended position of the robot arm.

In accordance with one or more aspects of the disclosed embodiments the motion compensation distance calculated by the controller is independent of controller registry of the encoder data identifying position of the robot arm.

In accordance with one or more aspects of the disclosed embodiments controller registration of arm position proximity to or in the predetermined repeatable retracted position is decoupled (independent) from receipt by the controller of encoder data of the at least one drive axis.

In accordance with one or more aspects of the disclosed embodiments the controller is configured to image, with the camera, the at least part of the robot arm and/or at least a different part of the robot arm (with a predetermined position relative to the at least part of the robot arm) extending to or in a predetermined extended position defined by the at least one independent drive axis, the controller effecting capture of a second image of the at least part of the robot arm and/or at least the different part of the robot arm extending to or in the predetermined extended position, and wherein the controller is configured to calculate another positional variance of the at least part of the robot arm from comparison of the second image with another calibration image of the at least part of the robot arm and/or at least the different part of the robot arm, and from the other positional variance determine a further motion compensation distance combined with the motion compensation distance so as to define a total motion compensation changing the extended position of the robot arm.

In accordance with one or more aspects of the disclosed embodiments the motion compensation distance and further motion compensation distance are combined at least as vector component distances to define the total motion compensation changing the extended position of the robot arm.

In accordance with one or more aspects of the disclosed embodiments a method is provided. The method including providing a transport chamber of a substrate transport apparatus, the transport chamber having a substrate transport opening arranged for communication with a substrate station module, providing a drive section connected to the transport chamber, and having a motor defining at least one independent drive axis, providing a robot arm mounted inside the transport chamber, and having an end effector at a distal end of the robot arm, configured to support a substrate thereon, the robot arm being operably connected to the drive section generating, with the at least one independent drive axis, at least robot arm motion in a radial direction extending and retracting the robot arm and moving the end effector, in the radial direction, from a retracted position to an extended position, imaging, with a camera of an imaging system mounted in a predetermined location with respect to the transport chamber, at least part of the robot arm moving to or in a predetermined repeatable position defined by the at least one independent drive axis, capturing, with a controller communicably connected to the imaging system, a first image of the at least part of the robot arm on registry of the robot arm proximate to or in the predetermined repeatable position decoupled from encoder data of the at least one drive axis, and calculating, with the controller, a positional variance of the at least part of the robot arm from comparison of the first image with a calibration image of the at least part of the robot arm, and from the positional variance determining a motion compensation factor changing the extended position of the robot arm.

In accordance with one or more aspects of the disclosed embodiments the determining the motion compensation factor, calculated by the controller, is independent of controller registry of the encoder data identifying position of the robot arm.

In accordance with one or more aspects of the disclosed embodiments the at least part of the robot arm captured in the first image includes a robot arm feature, imaged in the first image, with a predetermined substantially steady state dimension relative to a predetermined substrate hold position of the end effector.

In accordance with one or more aspects of the disclosed embodiments the substantially steady state dimension has a dimension component aligned with the radial direction and another dimension component in a direction angled at a non-zero crossing angle with the radial direction.

In accordance with one or more aspects of the disclosed embodiments calculating the positional variance, with the controller, from the comparison of the first image and calibration image of the at least part of the robot arm includes comparing a positional variance component in the radial direction and another variance component in a direction angled at a non-zero crossing angle with the radial direction, and the motion compensation factor changes the extended position of the robot arm in at least one of the radial direction and in the angled direction.

In accordance with one or more aspects of the disclosed embodiments the at least part of the robot arm captured in the first image includes the end effector with a substrate thereon, which end effector with substrate being imaged in the first image, the method further including determining, with the controller, a substrate eccentricity with respect to a predetermined substrate hold position of the end effector.

In accordance with one or more aspects of the disclosed embodiments programming the controller so as to determine a center of the imaged substrate in the first image and determining, with the controller, the position variance from comparison of the determined center of the imaged substrate with the predetermined substrate hold position in the calibration image of the at least part of the robot arm.

In accordance with one or more aspects of the disclosed embodiments determining, with the controller, the position variance due to thermal changes of the robot arm from comparison of the robot arm feature imaged in the first image with a calibration image of the robot arm feature in the calibration image of the at least part of the robot arm.

In accordance with one or more aspects of the disclosed embodiments the at least part of the robot arm captured in the first image includes an indicia pattern with an incremental distribution of indicia on the at least part of the robot arm, and imaged in the first image, the method further including determining, with the controller, the position variance due to thermal changes of the robot arm from comparison of the incremental distribution of indicia imaged in the first image with a calibrated distribution of indicia.

In accordance with one or more aspects of the disclosed embodiments the indicia pattern has a planar distribution in the radial direction and a direction angled at a non-zero crossing angle to the radial direction.

In accordance with one or more aspects of the disclosed embodiments generating the calibration image from design information rendering virtual representation of the least part of the robot arm disposed by design in the camera field of view.

In accordance with one or more aspects of the disclosed embodiments generating the calibration image, with the controller, by effecting capture of the calibration image, with the camera, of the at least part of the robot arm with the arm position proximate or in the predetermined repeatable position.

In accordance with one or more aspects of the disclosed embodiments imaging, with the camera, the at least part of the robot arm and/or at least a different part of the robot arm moving to or in a different predetermined radial position defined by the at least one independent drive axis, effecting capture, with the controller, of a second image of the at least part of the robot arm and/or at least the different part of the robot arm moving to or in the different predetermined radial position, calculating, with the controller, another positional variance of the at least part of the robot arm from comparison of the second image with another calibration image of the at least part of the robot arm and/or at least the different part of the robot arm corresponding to the different predetermined radial position, and determining a further motion compensation distance combined with the motion compensation distance so as to define a total motion compensation changing the extended position of the robot arm.

In accordance with one or more aspects of the disclosed embodiments the further motion compensation distance defines a correction factor to the motion compensation distance to determine the total motion compensation changing the extended position of the robot arm.

What is claimed is:

1. A substrate transport apparatus comprising:
   a transport chamber with a substrate transport opening arranged for communication with a substrate station module;
   a drive section connected to the transport chamber, and having a motor defining at least one independent drive axis;
   a robot arm mounted inside the transport chamber, and having an end effector at a distal end of the robot arm, configured to support a substrate thereon, the robot arm being operably connected to the drive section generating, with the at least one independent drive axis, at least arm motion moving the end effector relative to the transport chamber, from a first position to a second position different from the first position;
   an imaging system with a camera mounted in a predetermined location with respect to the transport chamber and disposed so as to image at least part of the robot arm; and
   a controller communicably connected to the imaging system and configured to image, with the camera, the at least part of the robot arm moving to or in a predetermined repeatable position defined by the at least one independent drive axis, the controller effecting capture of a first image of the at least part of the robot arm on registry of the robot arm proximate to or in the predetermined repeatable position decoupled from encoder data of the at least one drive axis,
   wherein the controller is configured to calculate a positional variance of the at least part of the robot arm from comparison of the first image with a calibration image of the at least part of the robot arm, and from the positional variance determine a motion compensation factor changing an extended position of the robot arm effected at least via extension of the robot arm, in an arm extension direction, by the motor of the drive section.

2. The substrate transport apparatus of claim 1, wherein the determined motion compensation factor calculated by the controller is independent of controller registry of the encoder data identifying position of the robot arm.

3. The substrate transport apparatus of claim 1, wherein the positional variance calculated by the controller from the comparison of the first image and calibration image of the at least part of the robot arm include a positional variance component in the arm extension direction and another variance component in a direction angled at a non-zero crossing angle with the arm extension direction, and the motion compensation factor changes the extended position of the robot arm in at least one of the arm extension direction and in the angled direction.

4. The substrate transport apparatus of claim 1, wherein the at least part of the robot arm captured in the first image includes the end effector with a substrate thereon, which end effector with substrate being imaged in the first image, and the controller determines a substrate eccentricity with respect to a predetermined substrate hold position of the end effector.

5. The substrate transport apparatus of claim 4, wherein the controller is programmed so as to determine a center of the imaged substrate in the first image and determine the position variance from comparison of the determined center of the imaged substrate with the predetermined substrate hold position in the calibration image of the at least part of the robot arm.

6. The substrate transport apparatus of claim 1, wherein the at least part of the robot arm captured in the first image includes a robot arm feature, imaged in the first image, with a predetermined substantially steady state dimension relative to a predetermined substrate hold position of the end effector.

7. The substrate transport apparatus of claim 6, wherein the substantially steady state dimension has a dimension component aligned with the arm extension direction and another dimension component in a direction angled at a non-zero crossing angle with the arm extension direction.

8. The substrate transport apparatus of claim 6, wherein the controller determines the position variance due to thermal changes of the robot arm from comparison of the robot arm feature imaged in the first image with a calibration image of the robot arm feature in the calibration image of the at least part of the robot arm.

9. The substrate transport apparatus of claim 6, wherein the at least part of the robot arm captured in the first image includes an indicia pattern with an incremental distribution of indicia on the at least part of the robot arm, and imaged in the first image, and the controller determines the position variance due to thermal changes of the robot arm from comparison of the incremental distribution of indicia imaged in the first image with a calibrated distribution of indicia.

10. The substrate transport apparatus of claim 9, wherein the indicia pattern has a planar distribution in the arm extension direction and a direction angled at a non-zero crossing angle to the arm extension direction.

11. The substrate transport apparatus of claim 1, wherein the calibration image is generated from design information rendering virtual representation of the least part of the robot arm disposed by design in a camera field of view.

12. The substrate transport apparatus of claim 1, wherein the calibration image is generated by the controller effecting capture of the calibration image, with the camera, of the at least part of the robot arm with the arm position proximate or in the predetermined repeatable position.

13. The substrate transport apparatus of claim 1, wherein the controller is configured to image, with the camera, the at least part of the robot arm and/or at least a different part of the robot arm moving to or in a different predetermined radial position defined by the at least one independent drive axis, the controller effecting capture of a second image of the at least part of the robot arm and/or at least the different part of the robot arm moving to or in the different predetermined radial position, and wherein the controller is configured to calculate another positional variance of the at least part of the robot arm from comparison of the second image with another calibration image of the at least part of the robot arm and/or at least the different part of the robot arm corresponding to the different predetermined radial position, and from the other positional variance determine a further motion compensation distance combined with the motion compensation distance so as to define a total motion compensation changing the extended position of the robot arm.

14. The substrate transport apparatus of claim 13, wherein the further motion compensation distance defines a correction factor to the motion compensation distance to determine the total motion compensation changing the extended position of the robot arm.

15. A substrate transport apparatus comprising:
a transport chamber with a substrate transport opening arranged for communication with a substrate station module;
a drive section connected to the transport chamber, and having a motor defining at least one independent drive axis;
a robot arm mounted inside the transport chamber, and having an end effector at a distal end of the robot arm, configured to support a substrate thereon, the robot arm being operably connected to the drive section generating, with the at least one independent drive axis, at least arm motion moving the end effector relative to the transport chamber, from a first position to a second position different than the first position;
an imaging system with a camera mounted in a predetermined location with respect to the transport chamber and disposed so as to image at least part of the robot arm; and
a controller communicably connected to the imaging system and configured to image, with the camera, the at least part of the robot arm retracting to or in a predetermined repeatable first position defined by the at least one independent drive axis, the controller effecting capture of a first image of the at least part of the robot arm on registry of the robot arm retraction proximate to or in the predetermined repeatable first position,
wherein the controller is configured to identify a positional variance of the at least part of the robot arm from comparison of the first image with a calibration image of the at least part of the robot arm, and from the positional variance determine a motion compensation distance changing an extended position of the robot arm effected at least via extension of the robot arm in an arm extension direction, by the motor of the drive section.

16. The substrate transport apparatus of claim 15, wherein the motion compensation distance calculated by the controller is independent of controller registry of the encoder data identifying position of the robot arm.

17. The substrate transport apparatus of claim 15, wherein controller registration of arm position proximity to or in the predetermined repeatable first position is decoupled from receipt by the controller of encoder data of the at least one drive axis.

18. The substrate transport apparatus of claim 15, wherein the controller is configured to image, with the camera, the at least part of the robot arm and/or at least a different part of the robot arm extending to or in a predetermined second position defined by the at least one independent drive axis, the controller effecting capture of a second image of the at least part of the robot arm and/or at least the different part of the robot arm extending to or in the predetermined second position, and wherein the controller is configured to calculate another positional variance of the at least part of the robot arm from comparison of the second image with another calibration image of the at least part of the robot arm and/or at least the different part of the robot arm, and from the other positional variance determine a further motion compensation distance combined with the motion compensation distance so as to define a total motion compensation changing the extended position of the robot arm.

19. The substrate transport apparatus of claim 18, wherein the motion compensation distance and further motion compensation distance are combined at least as vector component distances to define the total motion compensation changing the extended position of the robot arm.

20. A method comprising:
providing a transport chamber of a substrate transport apparatus, the transport chamber having a substrate transport opening arranged for communication with a substrate station module;
providing a drive section connected to the transport chamber, and having a motor defining at least one independent drive axis;
providing a robot arm mounted inside the transport chamber, and having an end effector at a distal end of the robot arm, configured to support a substrate thereon, the robot arm being operably connected to the drive section;
generating, with the at least one independent drive axis, at least robot arm motion moving the end effector relative to the transport chamber, from a first position to a second position different than the first position;
imaging, with a camera of an imaging system mounted in a predetermined location with respect to the transport chamber, at least part of the robot arm moving to or in a predetermined repeatable position defined by the at least one independent drive axis;
capturing, with a controller communicably connected to the imaging system, a first image of the at least part of the robot arm on registry of the robot arm proximate to or in the predetermined repeatable position decoupled from encoder data of the at least one drive axis; and
calculating, with the controller, a positional variance of the at least part of the robot arm from comparison of the first image with a calibration image of the at least part of the robot arm, and from the positional variance determining a motion compensation factor changing an extended position of the robot arm effected at least via extension of the robot arm in an arm extension direction, by the motor of the drive section.

21. The method of claim 20, wherein the determining the motion compensation factor, calculated by the controller, is independent of controller registry of the encoder data identifying position of the robot arm.

22. The method of claim 20, further comprising calculating the positional variance, with the controller, from the comparison of the first image and calibration image of the at least part of the robot arm includes comparing a positional variance component in the arm extension direction and another variance component in a direction angled at a non-zero crossing angle with the arm extension direction, and the motion compensation factor changes the extended position of the robot arm in at least one of the arm extension direction and in the angled direction.

23. The method of claim 20, wherein the at least part of the robot arm captured in the first image includes the end effector with a substrate thereon, which end effector with substrate being imaged in the first image, the method further comprising determining, with the controller, a substrate eccentricity with respect to a predetermined substrate hold position of the end effector.

24. The method of claim 23, further comprising programming the controller so as to determine a center of the imaged substrate in the first image and determining, with the controller, the position variance from comparison of the determined center of the imaged substrate with the predetermined substrate hold position in the calibration image of the at least part of the robot arm.

25. The method of claim 20, wherein the at least part of the robot arm captured in the first image includes a robot arm feature, imaged in the first image, with a predetermined substantially steady state dimension relative to a predetermined substrate hold position of the end effector.

26. The method of claim 25, further comprising the substantially steady state dimension has a dimension component aligned with the arm extension direction and another dimension component in a direction angled at a non-zero crossing angle with the arm extension direction.

27. The method of claim 25, further comprising determining, with the controller, the position variance due to thermal changes of the robot arm from comparison of the robot arm feature imaged in the first image with a calibration image of the robot arm feature in the calibration image of the at least part of the robot arm.

28. The method of claim 25, wherein the at least part of the robot arm captured in the first image includes an indicia pattern with an incremental distribution of indicia on the at least part of the robot arm, and imaged in the first image, the method further comprising determining, with the controller, the position variance due to thermal changes of the robot arm from comparison of the incremental distribution of indicia imaged in the first image with a calibrated distribution of indicia.

29. The method of claim 28, wherein the indicia pattern has a planar distribution in the arm extension direction and a direction angled at a non-zero crossing angle to the arm extension direction.

30. The method of claim 20, further comprising generating the calibration image from design information rendering virtual representation of the least part of the robot arm disposed by design in a camera field of view.

31. The method of claim 20, further comprising generating the calibration image, with the controller, by effecting capture of the calibration image, with the camera, of the at least part of the robot arm with the arm position proximate or in the predetermined repeatable position.

32. The method of claim 20, further comprising imaging, with the camera, the at least part of the robot arm and/or at least a different part of the robot arm moving to or in a different predetermined radial position defined by the at least one independent drive axis, effecting capture, with the controller, of a second image of the at least part of the robot arm and/or at least the different part of the robot arm moving to or in the different predetermined radial position; and calculating, with the controller, another positional variance of the at least part of the robot arm from comparison of the second image with another calibration image of the at least part of the robot arm and/or at least the different part of the robot arm corresponding to the different predetermined radial position, and determining a further motion compensation distance combined with the motion compensation distance so as to define a total motion compensation changing the extended position of the robot arm.

33. The method of claim 32, wherein the further motion compensation distance defines a correction factor to the motion compensation distance to determine the total motion compensation changing the extended position of the robot arm.

* * * * *